US012652750B1

(12) United States Patent
Mohan et al.

(10) Patent No.: US 12,652,750 B1
(45) Date of Patent: Jun. 9, 2026

(54) INTERLOCKING STRUCTURE FOR CROSSTALK REDUCTION AND METHOD OF MANUFACTURE

(71) Applicant: Astera Labs, Inc., Santa Clara, CA (US)

(72) Inventors: Abhinaya Easwari Mohan, San Jose, CA (US); Zengji Zhao, Sunnyvale, CA (US); Yiqi Tang, Allen, TX (US)

(73) Assignee: Astera Labs, Inc., Santa Clara, CA (US)

( * ) Notice: Subject to any disclaimer, the term of this patent is extended or adjusted under 35 U.S.C. 154(b) by 137 days.

(21) Appl. No.: 18/651,648

(22) Filed: Apr. 30, 2024

(51) Int. Cl.
| | |
|---|---|
| *H05K 1/18* | (2026.01) |
| *H05K 1/02* | (2006.01) |
| *H05K 3/46* | (2006.01) |
| *H10W 42/20* | (2026.01) |
| *H10W 70/685* | (2026.01) |
| *H05K 1/181* | (2026.01) |
| *H05K 3/04* | (2006.01) |

(52) U.S. Cl.
CPC ......... *H05K 1/0224* (2013.01); *H05K 3/4602* (2013.01); *H10W 42/20* (2026.01); *H10W 70/685* (2026.01); *H05K 1/181* (2013.01); *H05K 3/041* (2013.01); *H05K 2201/0723* (2013.01)

(58) Field of Classification Search
CPC .... H05K 1/0224; H05K 3/4602; H05K 1/181; H05K 3/341; H05K 2201/0723; H01W 70/685; H10W 42/20
USPC .......................................................... 361/760
See application file for complete search history.

(56) References Cited

U.S. PATENT DOCUMENTS

| | | | |
|---|---|---|---|
| 11,785,718 B2 * | 10/2023 | Kono ..................... | H05K 3/368 361/804 |
| 2016/0155927 A1 * | 6/2016 | Kabasawa .......... | G01C 19/5783 257/419 |
| 2023/0207408 A1 * | 6/2023 | Dogiamis ............. | H01L 21/486 257/773 |

* cited by examiner

*Primary Examiner* — Binh B Tran
(74) *Attorney, Agent, or Firm* — Shield Intellectual Property PC

(57) ABSTRACT

An electronic system having a mounting substrate with a plurality of layers. The mounting substrate combines an upper shield structure and a lower shield structure to form an interlocking shielding structure to reduces crosstalk interference and improve return loss and insertion loss for high-speed serial communication circuits. The upper shield structure and the lower shield structure have a series of grounded reference shields that reduce unwanted electrical signal interferences.

20 Claims, 18 Drawing Sheets

| RECEIVE CHANNEL 152 | TOTAL PATH LENGTH 184 |
|---|---|
| TRANSMISSION CHANNEL 154 | PATH SEGMENT LENGTH 186 |

| RECEIVE CHANNEL 152 | TOTAL PATH LENGTH 184 |
|---|---|
| TRANSMISSION CHANNEL 154 | PATH SEGMENT LENGTH 186 |

302

332 / 334

| Package Stack-up 3-2-3 | Type | Material | Signal use | Thickness (mm) |
|---|---|---|---|---|
| | Solder Mask | AUS-SR1 | | 0.015 |
| L01 | GND | Copper | TX | 0.015 |
| | Dielectric | GL102 | | 0.033 |
| L02 | Signal | Copper | GND / PWR | 0.015 |
| | Dielectric | GL102 | | 0.033 |
| L03 | GND | Copper | RX | 0.015 |
| | Dielectric | GL102 | | 0.033 |
| L04 | PWR/GND | Copper | GND / PWR | 0.018 |
| | Core | LCA-832NSF | | 0.200 |
| L05 | PWR/GND | Copper | GND / PWR | 0.018 |
| | Dielectric | GL102 | | 0.033 |
| L06 | Signal | Copper | TX | 0.015 |
| | Dielectric | GL102 | | 0.033 |
| L07 | GND | Copper | GND / PWR | 0.015 |
| | Dielectric | GL102 | | 0.033 |
| L08 | GND | Copper | GND / PWR | 0.015 |
| | Solder Mask | AUS-SR1 | | 0.015 |

326 310 312 314 316 330 318 320 322 324 328

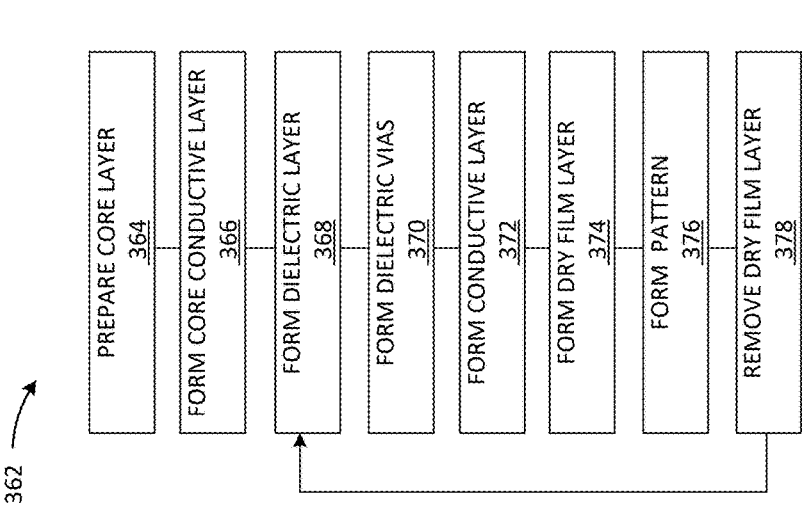

362

| PREPARE CORE LAYER 364 |
| FORM CORE CONDUCTIVE LAYER 366 |
| FORM DIELECTRIC LAYER 368 |
| FORM DIELECTRIC VIAS 370 |
| FORM CONDUCTIVE LAYER 372 |
| FORM DRY FILM LAYER 374 |
| FORM PATTERN 376 |
| REMOVE DRY FILM LAYER 378 |

FIG. 3B

| CONDUCTIVE LAYER 340 |
| VOID 346 |
| DIELECTRIC LAYER 352 |
| DIELECTRIC MATERIAL 354 |
| DRY FILM LAYER 356 |
| CIRCUITRY PATTERN 358 |

| INTERLOCKING SHIELD STRUCTURE 348 |
| TRACES 306 |
| VIAS 308 |
| CORE LAYERS 330 |

FIG. 3A

| PRINTED CIRCUIT BOARD 304 | CONDUCTIVE PORTION 342 |
| LAYERS 306 | DIELECTRIC PORTION 344 |
| CORE LAYERS 330 | |

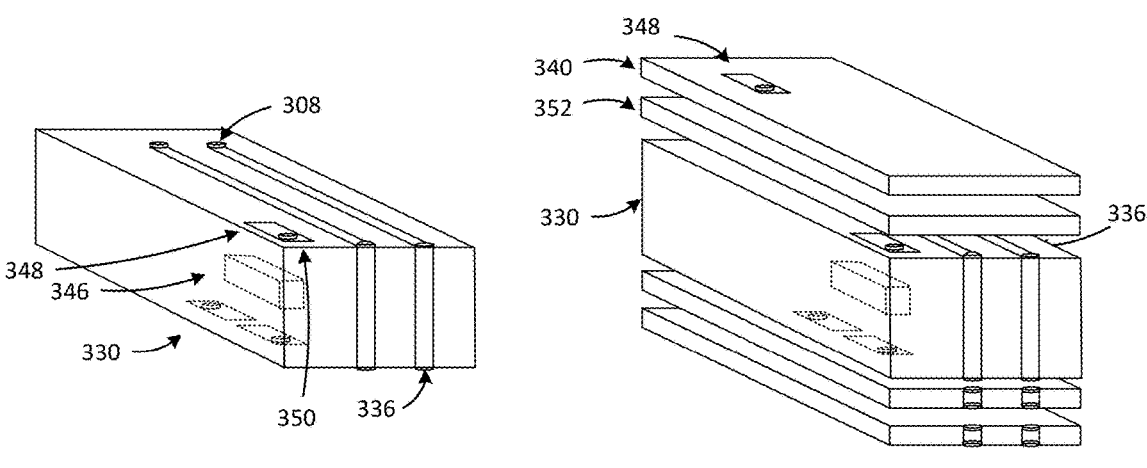
FIG. 3C
FIG. 3D
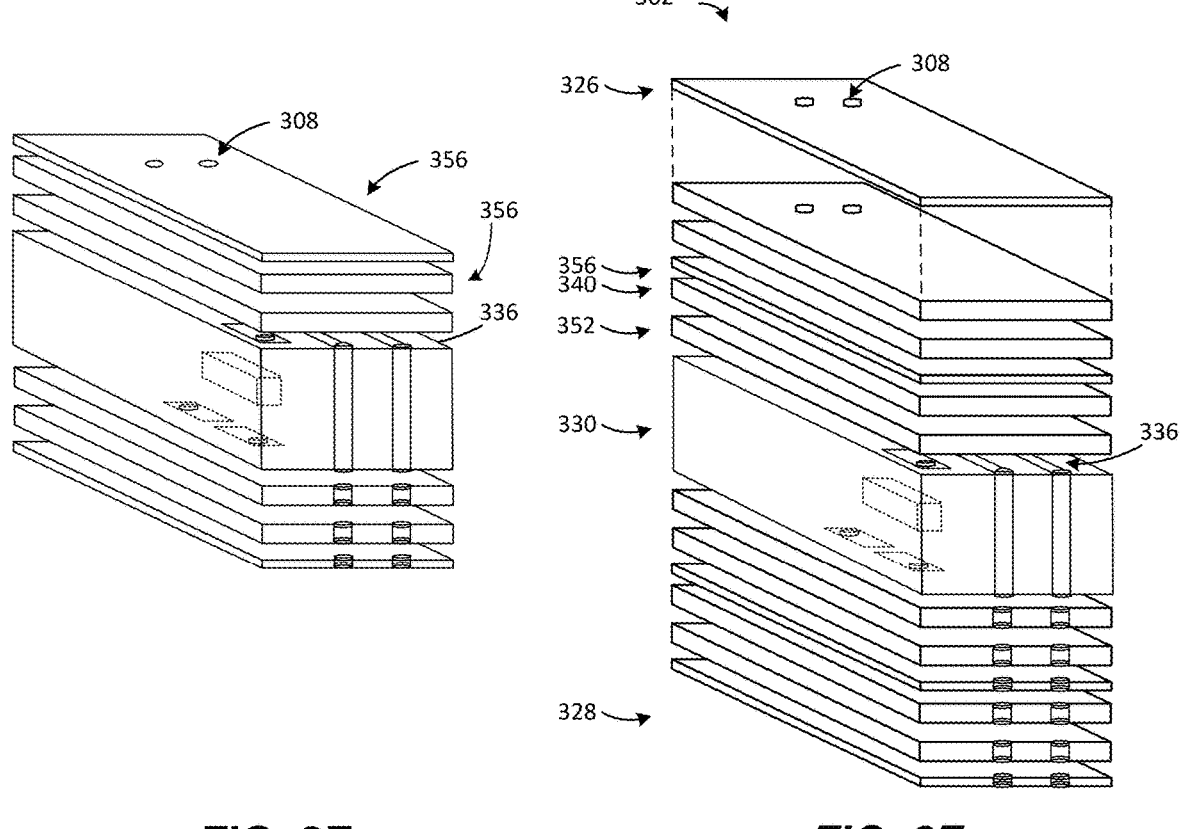
FIG. 3E
FIG. 3F

502

560

508

542

565

510

516

564

518

544

562

| LAYERS 506 |
| AGGRESSOR RADIATION 550 |
| VICTIM SIGNAL 552 |

602

660

608

610

616

664

618

644

662

| LAYERS 606 |
| AGGRESSOR RADIATION 650 |
| VICTIM SIGNAL 652 |

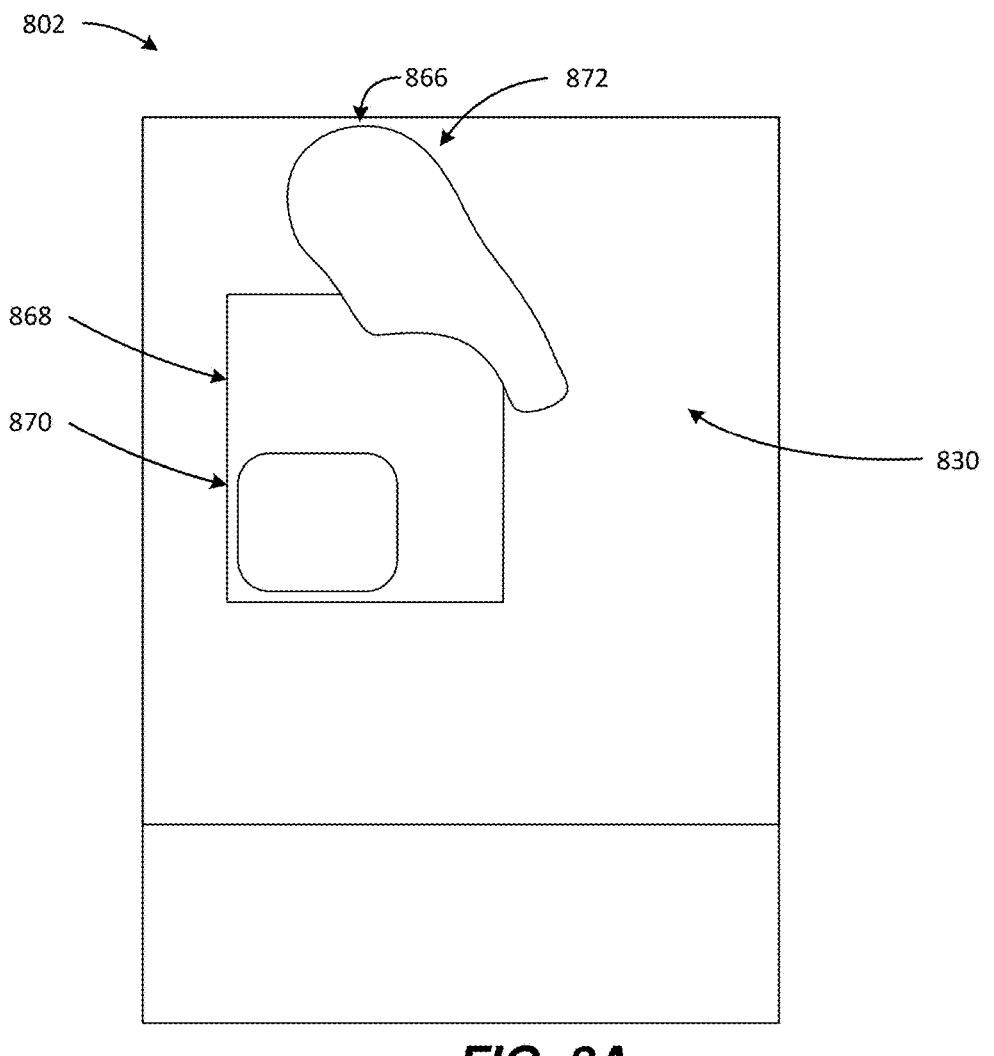
FIG. 8A
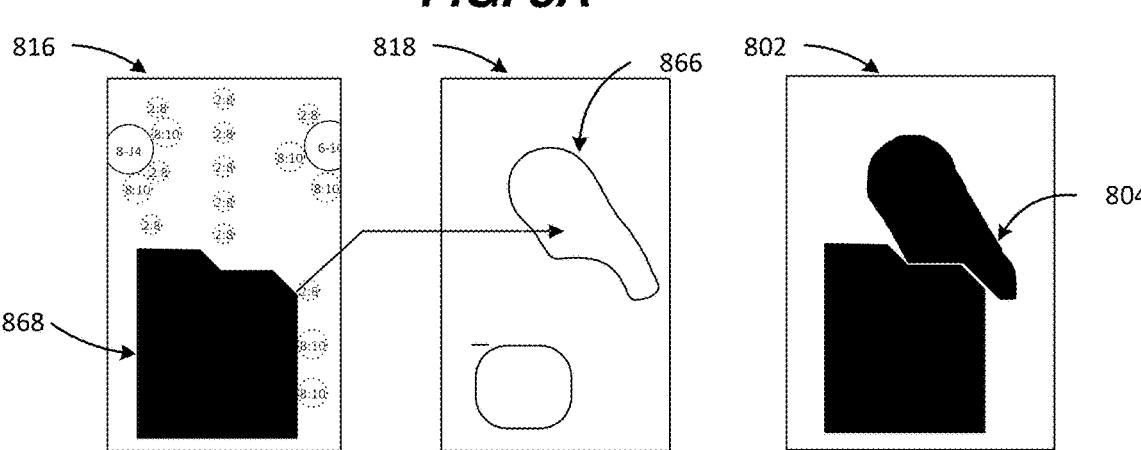
FIG. 8B FIG. 8C FIG. 8D

| REFERENCE SHIELDS 1032 | OVERLAP AREA 1068 |
| UPPER LAYER 1042 | LOWER REFERENCE SHIELD 1072 |
| LOWER LAYER 1044 | RECEIVE CHANNEL 1074 |
| CROSSTALK INTERFERENCE 1054 | TRANSMISSION LANE 1076 |

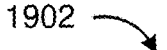

1902

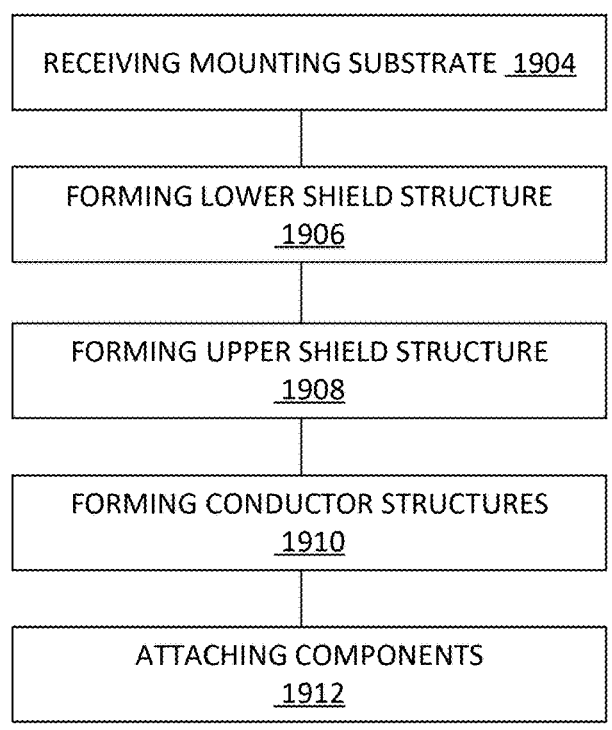

| RECEIVING MOUNTING SUBSTRATE <u>1904</u> |

| FORMING LOWER SHIELD STRUCTURE <u>1906</u> |

| FORMING UPPER SHIELD STRUCTURE <u>1908</u> |

| FORMING CONDUCTOR STRUCTURES <u>1910</u> |

| ATTACHING COMPONENTS <u>1912</u> |

| MOUNTING SUBSTRATE <u>1902</u> | UPPER SHIELD STRUCTURE <u>1978</u> |
|---|---|
| UPPER LAYER <u>1942</u> | LOWER SHIELD STRUCTURE <u>1980</u> |
| LOWER LAYER <u>1944</u> | TOP CONDUCTOR STRUCTURE <u>1982</u> |
| UPPER VOID VOLUME <u>1956</u> | BOTTOM CONDUCTOR STRUCTURE <u>1984</u> |
| LOWER VOID VOLUME <u>1958</u> | SURFACE PAD <u>1986</u> |
| CAPACITOR PAD <u>1960</u> | MOUNTING PAD <u>1988</u> |
| SOLDER BALL <u>1962</u> | TOP LAYER <u>1990</u> |
| UPPER REFERENCE SHIELD <u>1970</u> | BOTTOM LAYER <u>1992</u> |
| LOWER REFERENCE SHIELD <u>1972</u> | BASE LAYER <u>1994</u> |
| | CORE LAYER <u>1996</u> |

*FIG. 19*

INTERLOCKING STRUCTURE FOR CROSSTALK REDUCTION AND METHOD OF MANUFACTURE

TECHNICAL FIELD

Embodiments relate generally to electrical structures for improving performance in electronic circuit packages and more specifically, to electronic package substrates with interlocking structures for crosstalk reduction to improve performance and methods of manufacture.

BACKGROUND OF THE INVENTION

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

The development of electronic circuitry and products has been influenced by the physical and electrical properties of the materials and structures used to form the electronic components and electric circuitry. In addition, new functionality requires a high degree of performance which requires faster clock and signal speeds.

Electronic components must be electrically connected to other electronic components and system(s) for proper operation. Electronic components can be mounted on multilayer circuit boards and electrically coupled with power distribution networks having vertical vias, signal traces, power traces, and ground traces. The size, shape, power levels, and electrical parameters of the electronic components can have an impact on the operational performance.

The electrical properties of the electronic components and power distribution components can influence the electrical operating properties of the circuit and negatively result in signal interference, instability, oscillation effects, power loss, signal leakage, reflection, frequency change, and other unintended effects. Reducing the effect of such electrical configurations can reduce unwanted effect and increase the overall efficiency of the circuit operation.

BRIEF DESCRIPTION OF DRAWINGS

The present invention is illustrated by way of example, and not by way of limitation, in the figures of the accompanying drawings and in which like reference numerals refer to similar elements and in which:

FIG. 3A depicts an example embodiment of a mounting substrate, FIG. 3B depicts another example embodiment of a manufacturing process for a mounting substrate, FIG. 3C depicts an example embodiment of a mounting substrate in a form core conductive layer step, FIG. 3D depicts an example embodiment of a mounting substrate in a form conductive layer step, FIG. 3E depicts an example embodiment of a mounting substrate in a form pattern step, FIG. 3F depicts an example embodiment of a mounting substrate in the remove dry file step, FIG. 8A depicts an example embodiment of layer view of a mounting substrate, FIG. 8B depicts an example embodiment of a fourth layer of a mounting substrate, FIG. 8C depicts an example embodiment of a fifth layer of a mounting substrate, FIG. 8D depicts an example embodiment of zipper structure of a mounting substrate, FIG. 19 depicts an example of a manufacturing process flow for the electronic system in an embodiment.

DETAILED DESCRIPTION OF THE INVENTION

In the following detailed description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Embodiments are described herein according to the following outline:

1.0. Overview
2.0. System Overview
3.0. Performance Analysis
4.0. Functional Overview
5.0. Example Embodiments
6.0. Extensions and Alternatives

1.0. Overview

Approaches, techniques, and mechanisms are disclosed for manufacturing and use of the electronic systems discussed herein including electronic systems with multi-layer components and substrates. The electronic systems and components can support high performance electrical operation by improving the electrical characteristics of mounting substrate. The configuration of the conductive traces carrying signals and power can improve electrical performance.

According to an embodiment, the system can include a mounting substrate having an interlocking zipper structure formed from at least an upper shield structure and a lower shield structure. The upper shield structure can include an upper reference shield and a lower reference shield that are configured to overlap and interlock to reduce crosstalk interference.

According to an embodiment, the system can include an upper shield structure having an upper reference shield over an upper void volume. The combination of the grounded upper reference shield and the void volume can reduce the effects of return loss and insertion loss.

According to an embodiment, the system can include an interlocking zipper structure positioned between a surface conductor structure and a bottom conductor structure to block potential crosstalk and victim signals from aggressor radiators.

According to another embodiment, the electrical system can include attaching an electronic component to the mounting substrate. The electrical system can include the electronic components attached to the mounting substrate via solder balls, solder paste, silver sintered, or other similar surface mounting materials.

In other aspects, the inventive subject matter encompasses electronic systems configured to carry out the foregoing techniques.

2.0. System Overview

Figure 1:
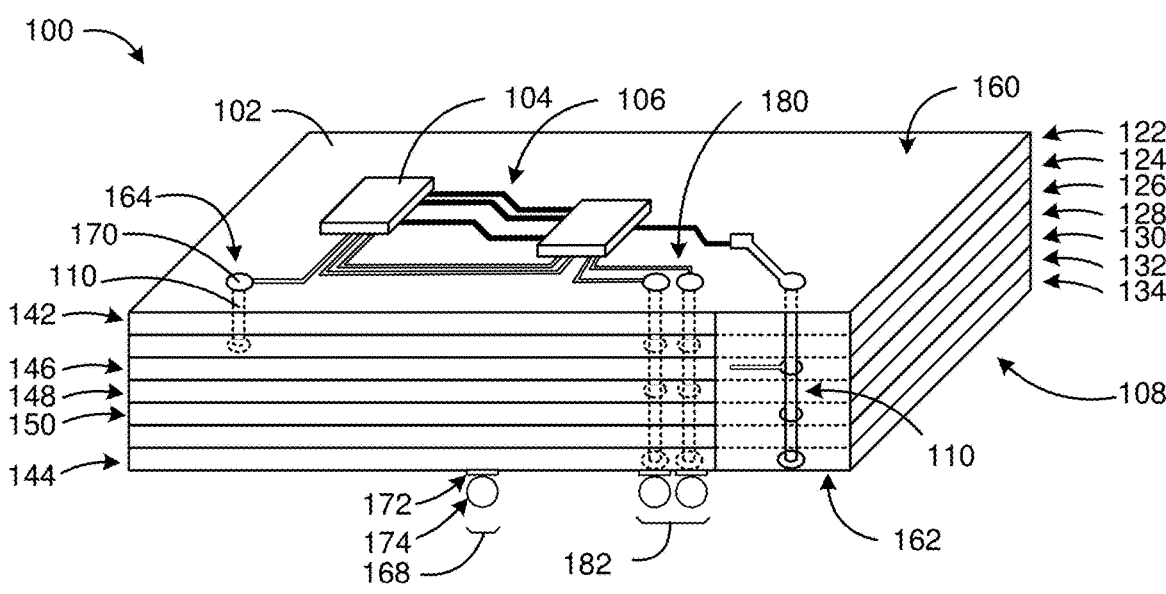
FIG. 1 depicts an example embodiment of an electronic system.

FIG. 1 illustrates an example embodiment of an electronic system 100. The electronic system 100 can have electronic components 104 attached to a mounting substrate 102. The mounting substrate 102 can couple the electronic components 104 to other ones of the electronic components 104 and to other portions of the system 100.

The electronic system 100 can be a system or submodule of a system. For example, the electronic system 100 can be an electronic package, a printed circuit board, a motherboard, a daughter board, a standalone system, or other similar systems and devices.

The electronic system 100 can include one or more of the electronic components 104 attached to the mounting substrate 102. The mounting substrate 102 is a multilayer structure for coupling electronic components 104 to other electronic components 104 and to the rest of the electronic system 100. The layers of the mounting substrate 102 can have a variety of configurations. For example, the layers can be a combination of insulating materials and conductive traces transferring signals or power. The electronic components 104 can be coupled to other components with signal traces 106. The signal traces 106 are conductive paths for transferring signals and power. In another embodiment, the mounting substrate 102 can be a printed circuit board 108 (PCB 108), electronic package, or other similar elements.

The mounting substrate 102 can have a variety of types of different layers. In some embodiments, the mounting substrate 102 can have layers including signal trace layers, power layers, ground plane layers, insulation layers, electromagnetic shielding layers, external connection layers, and/or other similar layers.

The electronic components 104 are the elements used to provide the functionality of the electronic system 100. The electronic components 104 can be active or passive components. For example, the electronic components 104 can be active components such as integrated circuits, processors, field programmable gate arrays, transistors, ball grid array components, or other similar active components. The electronic components 104 can be passive components such as resistors, capacitors, inductors, connectors, interfaces, contact pads, or other similar passive components.

The mounting substrate 102 can include a plurality of substrate layers 110 formed from insulating and conductive materials. For example, the mounting substrate 102 can include a conductive top portion formed on an insulating dielectric portion of the substrate layer 110.

In an illustrative embodiment, the mounting substrate 102 can include a first layer 122, a second layer 124, a third layer 126, a fourth layer 128, a fifth layer 130, a sixth layer 132, and a seventh layer 134. In other embodiments, the mounting substrate 102 can be configured with any number of layers.

The mounting substrate 102 can have a variety of configurations. The mounting substrate 102 can include a top layer 142 on a top side 160 of the mounting substrate 102, such as the first layer 122. A bottom layer 144 can be on a bottom side 162 of the mounting substrate 102, such as the seventh layer 134.

The top layer 142 can have a variety of configurations. The top layer 142 can include a top pad structure 164 having a top pad 170 electrically coupled to the via 110. For example, the top pad 170 can be a capacitor pad, a mounting pad, an interconnect pad, a surface trace, or other similar conductors.

The bottom layer 144 can have a variety of configurations. The bottom layer 144 can include a bottom pad structure 168 having a bottom pad 172 coupled to a solder ball 174. The bottom pad 172 can be a mounting pad, a solder pad, an interconnect pad, a surface pad, or other similar conductors. In some embodiments, the bottom pad structure 168 can be electrically coupled to a via, a trace, or other conductive element. In other embodiments, the solder ball 174 can be electrically coupled to an external component, such as a BGA package.

In some embodiments, the mounting substrate 102 can include one or more inner layers 146 between the top side and the bottom side. The mounting substrate 102 can include a ground layer 148, a power layer 150, signal layers, or a combination thereof.

The substrate layers 102 can be configured in a variety of ways. In some embodiments, the substrate layers 102 can have a conductive layer, such as a copper layer, formed directly on a dielectric layer, such as a fiberglass or prepreg layer. The conductive layer can be configured to form conductive traces for conducting signals and power to the electronic components.

The substrate layers 102 can be coupled vertically with vias 110. The vias 110 are vertical conductors that can conduct signals between different layers of the mounting substrate 102. The vias 110 can be through board vias, internal vias, blind vias, stacked vias, staggered vias, buried vias, or other similar types of vertical interconnects. The term vertical refers to a direction perpendicular to the flat surface of the mounting substrate or the individual layers. Similarly, the term horizontal refers to a directly generally parallel to the flat surface of the mounting substrate or the induvial layers.

In some embodiments, the via 110 can form a vertical interconnection between two layers that can include two or more horizontally offset vertical segments electrically coupled together on an intermediate layer, such as two individual via segments offset from one another but both electrically coupled at an intermediate layer between the two via segments. In an illustrative example, the vertical interconnect can include a top via segment offset from a middle via segment which is coupled to a bottom via segment. Each of the via segments can be one of the vias 110 such as an internal via, blind via, stacked via, staggered via, buried via, or other similar types of vertical interconnect.

The electronic components 104 can be attached to the mounting substrate 102 in a variety of ways. The electronic components 104 and the other components can be electrically coupled to the traces of the mounting substrate 102 by mounting, soldering, pressure connected, adhesive attachment, mechanical coupling, or other similar techniques.

In other embodiments, the electronic components 104, such as a ball grid array package, can be attached to the mounting substrate 102. The connection to the mounting substrate 102 can have a variety of configurations. The electronic components 104 can be attached directly to the mounting substrate 102, indirectly mounted in a socket, connected to another component, stacked, linked via a network connection, attached through a connector, or other techniques.

The configuration of the circuitry of the electronic system 100 can produce electrical effects that can impact the performance of the electronic system 100. Inductance, resistance, reactance, and capacitance are basic elemental properties of all electrical systems.

In some embodiments, the electronic system 100 can be used to provide data transmission and reception functionality. Portions of the electronic system 100 can implement functionality such as a serializer/deserializer (SerDes) circuit for converting parallel data to serial data and back. SerDes can be used to send serial data over a single line or a differential pair of lines for data transmission. This can reduce pin counts and simplify interconnection requirements.

In some embodiments, some of the signal paths 180 in the mounting substrate 102, such as a receive channel and a transmission channel, can be configured as differential pairs 182. The differential pair 182 is an electrical circuit that can have two signal paths that carry equal magnitude and opposite polarity signals on each trace. Each of the signal paths 180 can have the same total path length 184 to allow the signals to arrive at the same time on each of the signal paths 180. The signal path 180 can include all of the conductors between a starting point and an end point. The signal path can include a starting pad, one or more traces, one or more vias, and an ending pad. The total path length 184 can be the total of the path segments lengths 186 for the all of the components of the signal path 180.

In some embodiments, the path segments lengths 186 can include the length of the traces, vias, and other conductive elements. The conductive elements making up the differential pair 182 can be configured to have the same total path length 184. For example, two of the traces of the signal path can be routed individually to achieve the same path segment length 186. Additionally, the length of a vias can be configured to have the same length including an offset conductor or traces leading to the vias. This can include having vias offset from one another by offset conductors or traces having the same length to ensure the total path length 184 is equal along both signal paths.

For example, portions of the electronic system 100 can implement a Pulse Amplitude Modulation 4-level (PAM4) signal encoding protocols to send and receive data in a serial fashion using four voltage levels to encode two bits of binary data. By encoding more data per unit time, the PAM4 protocol can transfer data at twice the rate of protocols such as NRZ (non-return to zero)/PAM2 protocols.

The PAM4 protocol can support different transmission frequencies. For example, the PAM4 can support signals operating at 56 Gigahertz (GHz), 112 GHz, and higher. Because PAM4 operates at higher frequencies, there is a need to improve crosstalk performance, typically below −60 dB while maintaining other electrical performance specifications such as low return loss and insertion loss.

In some embodiments, AC coupling capacitors can be used on the package to improve the data channel performance. The data channels can include receive channel 152 (RX channel 152) and a transmission channel 154 (TX channel 154). The electronic system 100 can send data on the transmission channel 154 and receive data on the receive channel 152. In some embodiments, the RX channel 152 and the transmission channel 154 can be configured as differential pair circuits.

The presence of the capacitors on package can require a large footprint area for the capacitor pads that can lead to high parasitic capacitance. In some configurations, the mounting substrate can be configured with voids below the capacitor pads. Depending on the configuration, the voids can be found to provide insufficient ground shielding. This can allow the electrical field to freely couple to adjacent channels and impair the crosstalk performance against tight crosstalk requirements. Alternatively, filling the void with ground shielding can adversely impact the return loss performance due to the capacitor pads.

In other embodiments, the package size can be increased by routing signal traces further apart. Another embodiment can increase the stackup to provide additional transition layers to allow the extra layers to add physical distance between transmission (TX) and receive (RX) interconnects.

In some embodiments, the mounting substrate 102 can be configured with a zipper structure having interlocking ground planes on two immediate adjacent layers to provide shielding between the RX and TX interconnects. The zipper structure can be configured as an interlocking shielding structure for reducing electromagnetic interference. The terms zipper structure, interlocking zipper structure, and interlocking shielding structure can be used interchangeably. The interlocking shielding structure can include shielding plates that can be overlapped from a vertical or top perspective. The interlocking shielding structure can have a mechanical structure with different adjacent shielding structures to be interlocked with one another similar to a mechanical zipper with some degree of overlap between the two elements. The interlocking shielding structure can have elements that are interlocking and overlapping with one another. The interlocking zipper structure can provide a shielding effect while avoiding adding unwanted metal to impact the return loss. Thus, this type of configuration can provide lower crosstalk while maintaining the same return loss performance.

Figure 2:
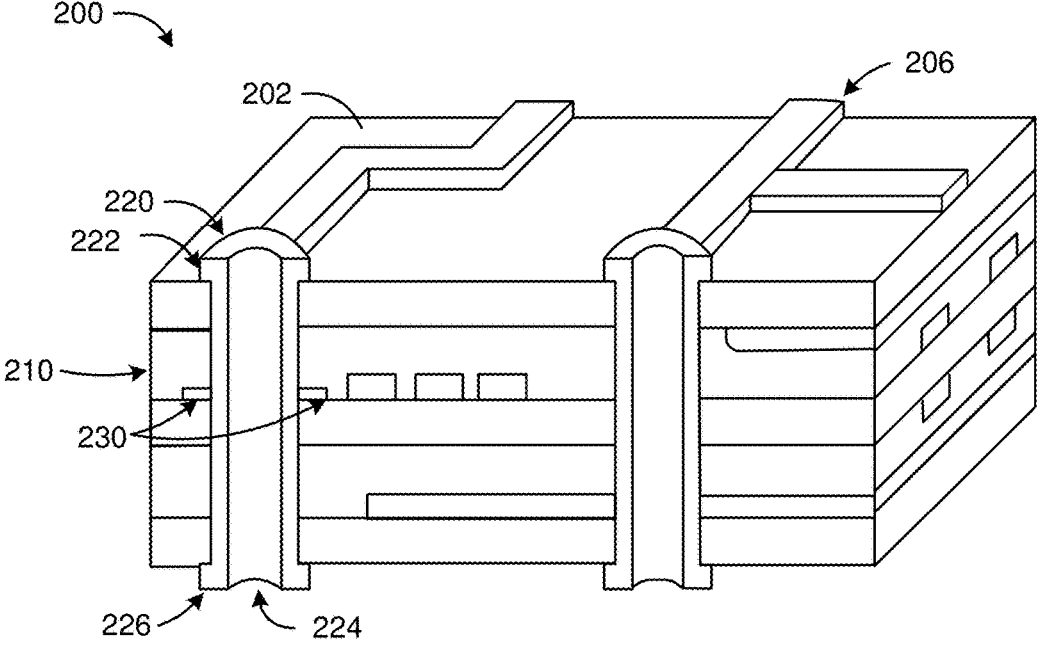
FIG. 2 depicts an example embodiment of a mounting substrate of the electronic system.

FIG. 2 illustrates an example embodiment of the mounting substrate 202 of the electronic system 200. The mounting substrate 202 can include a plurality of traces 206 and vias 220.

The traces 206 are conductive elements for transferring power and signals between the electrical components 104 and other system components. The substrate traces 206 can be formed in a variety of ways. For example, the traces 206 can be formed by applying a mask and photoetching the conductive portion of one of the layers.

The mounting substrate 202 can include vias 220 providing vertical interconnection between two or more layers. The vias 220 can extend through one or more of the substrate layers 210.

The vias 220 can be electrically coupled to a via pad 222 on one of the substrate layers 210. The via pad 222 can be located at the top side or bottom side of one of the vias 220 to provide connectivity to other elements. The via pad 222 is a conductive element for connecting to the vias 220.

The mounting substrate 202 can include a variety of pads that are conductive elements. The pads can include surface pads, via pads, interface pads, contact pads, mounting pads, stacking pads, and/or other similar types. The term pad can be used interchangeably for the different types of pads.

The vias 220 can be formed in a variety of ways. In some embodiments, the vias 220 can be formed by drilling a via hole 226 and plating the inside of the via hole with a conductive material to form via walls 224.

In some embodiments, the vias 220 can be electrically coupled to one or more internal pads 230 embedded within substrate layers of the mounting substrate 202. The internal pads 230 can be horizontal interconnect structures that can be electrically coupled to one or more of the substrate traces 206.

In other embodiments, the vias 220 can be configured to operate similar to transmission lines. For example, higher frequency signals can result in transmission line-like performance issues, such as reflection, crosstalk, interference, power loss, or other similar issues.

FIGS. 3A, 3B, 3C, 3D, 3E, and 3F illustrate example embodiments of a mounting substrate 302. Each of the layers 306 can support different functionality and different electrical connectivity between the layers 306 of the mounting substrate 302.

FIG. 3A illustrates an example embodiment of the mounting substrate 302. The mounting substrate 302 can be an electromechnaical structure for routing and transferring signals and power to components coupled to the mounting substrate 302.

The mounting substrate 302 can have a variety of configurations. For example, the mounting substrate 302 can be a printed circuit board 304 (PCB 304), a double-sided PCB, flexible circuit board, chip package, packaging substrate, daughter board, or other similar structure.

The printed circuit board 304 can have multiple layers 306 in direct contact with each adjacent layer. The layers 306 can include signal routing layers, power plane layers, ground play layers, power routing layers, thermal management, electromagnetic shielding, or other similar functions.

In some embodiments, the layers 306 can include conductive portions 342 and dielectric portions 344 bonded together. The conductive portions 342 can be formed from copper, gold, aluminum, or other conductive substances. The conductive portions 342 can include signal traces, power traces, power planes, ground traces, ground planes, or a combination thereof.

The dielectric portions 344 can be formed using epoxy, resin, plastic, polymers, fiberglass, pre-impregnated ("prepreg") materials, or other similar materials. The dielectric portions 334 can form the structural base of each of the layers with the conductive portions 342 forming traces, vias, and planes on and through the layers.

The dielectric portions 344 can be formed using different dielectric materials such as Taiyo™ AUS-SR1, Ajinomoto Build-Up Film® GL102, Mitsubishi® 832NSF-LCA, or similar materials. The dielectric materials have properties such as a low dielectric constant (Dk) and low dielectric loss (Df). In some embodiments, a glass substrate can have a dielectric constant of 5.4 and a dielectric loss of 0.005 at 10 gigahertz (GHz). A dielectric material such as GL102 can have a dielectric constant of 3.3 and a dielectric loss of 0.0044 at 5.8 GHz.

In some embodiments, the mounting substrate 302 can be configured with different numbers of layers. In some embodiments, the mounting substrate 302 can have eight layers such as a first layer 310, a second layer 312, a third layer 314, a fourth layer 316, a fifth layer 318, a sixth layer 320, a seventh layer 322, and an eighth layer 324. The mounting substrate 302 can include a top layer 332 and a bottom layer 334.

In some embodiments, the mounting substrate 302 can include one or more core layers 330. The core layers 330 can also be designated base layers. The core layers 330 are located in the middle of the mounting substrate 302 and can be formed with different dielectric materials than the other layers. During manufacture, the other layers can be formed on the top and bottom of the core layers 330. The mounting substrate 302 can be configured as a single sided or double-sided substrate. For example, the mounting substrate 302 can be single-sided PCB, a double-sided PCB, an electronic package substrate, or other similar configurations.

In some embodiments, the layers 306 can be configured as described below. The first layer 310 can be configured as a ground layer having a conductive layer with a thickness of 0.015 millimeters (mm) and the dielectric with a thickness of 0.033 mm. The first layer 310 can be used for transmission functions.

The second layer 312 can be configured as a signal layer formed having a conductive layer with a thickness of 0.015 mm and a dielectric layer with a thickness of 0.033 mm. The second layer 312 can be used for power and ground functions.

The third layer 314 can be configured as a ground layer formed having a conductive layer with a thickness of 0.015 and a dielectric layer with a thickness of 0.033 mm. The third layer 314 can be used for receiving functions.

The fourth layer 316 can be configured as a power and ground layer and formed on a core layer 330. The conductive layer can have a thickness of 0.018 mm and the core layer 330 can have a dielectric layer with a thickness of 0.200 mm. The core layer 330 can be formed with a dielectric material such as 832NSF-LCA. The fourth layer 316 can be used for power and ground functions.

The fifth layer 318 can be a power and ground layer and formed on the core layer 330. The fifth layer 318 can be formed on a bottom side of the core layer 330. The fifth layer 318 can have a conductive layer formed directly on the core layer 330. The fifth layer 318 can have a dielectric layer formed directly on the conductive layer. The fifth layer 318 can have a conductive layer with a thickness of 0.015 mm and a dielectric layer with a thickness of 0.033 mm.

The sixth layer 320 can be configured as a signal layer formed having a conductive layer with a thickness of 0.015 mm and a dielectric layer with a thickness of 0.033 mm. The sixth layer 320 can be used for transmission functions.

The seventh layer 322 can be configured as a ground layer formed having a conductive layer with a thickness of 0.015 mm and a dielectric layer with a thickness of 0.033 mm. The sixth layer 320 can be used for power and ground functions.

The eighth layer 324 can be configured as a ground layer formed having a conductive layer with a thickness of 0.015 mm and a dielectric layer with a thickness of 0.033 mm. The eighth layer 324 can be used for power and ground functions.

The mounting substrate can include protective solder mask layers on the outer layers of the mounting substrate 302. The solder mask layers can include a top solder mask layer 326 over the first layer 310 and a bottom solder mask layer 328 below and in direct contact with the bottom layer, such as the eighth layer 324. The solder mask layers can be protective layers of polymer material configured to protect the underlying layer from oxidation, corrosion, contamination, dust, dirt, liquids, short circuits, etc., during operation.

In some embodiments, the mounting substrate 302 can be a double-sided printed circuit board having the core layer 330. The mounting substrate 302 can be formed by applying additional layers on the top and bottom side of the core layer 330. The mounting substrate 302 can be formed by forming the fourth layer 316 and the fifth layer 318 directly on the core layer 330. The third layer 314 can then be formed on the fourth layer 316 and the sixth layer 320 can be formed on the fifth layer 318. The second layer 312 can be formed on the third layer 314 and the seventh layer 322 can be formed on the sixth layer 320. The first layer 310 can be formed on the second layer 312 and the eighth layer 324 can be formed on the seventh layer 322. The top solder mask layer 324 can be formed on the first layer 310 and the bottom solder mask layer 328 can be formed on the eighth layer 324.

In some embodiments, the layers of the mounting substrate 302 can be formed in different ways depending on the manufacturing technology used. Each of the layers 306 can include the conductive layer and the dielectric layer.

FIG. 3B illustrates an embodiment of a manufacturing process 362 for a mounting substrate 302. The mounting substrate 302 is an electromechnaical structure for routing and transferring signals and power to components coupled to the mounting substrate 302.

The manufacturing process 362 for the mounting substate 302 can include a prepare core layer step 364, a form core conductive layer step 366, a form dielectric layer step 368, a form dielectric vias step 370, a form conductive layer step 372, a form dry film layer step 374, a form pattern layer step 376, and a remove dry film layer step 378. The steps are described in more detail below.

The prepare core layer step 364 can include receiving the core layer 330 and preparing the core layer 330 for processing into the mounting substrate 302. In some embodiments, the core layer 330 can include a dielectric core material having conductive material pre-formed on the top and bottom sides.

The form core conductive layer step 366 forms the pattern of traces 336 and vias 308 in the core layer 330. The formation of the traces 336 and vias 308 can define a portion of an interlocking shield structure 348 and define a void 346. The interlocking shield structure 348 can also be described as a zipper structure. In some embodiments, the void 346 is a volume within the core layer 330 that is devoid of conductive materials. In other embodiments, the void 346 can be formed and defined across two or more of the layers 306 of the mounting substrate 302. The void 346 can be formed and defined by the boundary of the adjacent vias 308 and traces 336.

The form dielectric layer step 368 forms a dielectric layer 352 on a conductive layer 340 of the core layer 330. After the dielectric layer 352 is formed, it can be cured using heat in an oven.

The form dielectric vias step 370 can form the vias 308 in the dielectric layer 352. The vias 308 can be formed using laser drilling, mechanical drilling, etching, or other similar techniques. The vias 308 in the dielectric layer 352 correspond to the vias 308 in the core layer 330.

The form conductive layer step 372 forms a conductive layer 340 directly on the dielectric layer 352. The conductive layer 340 can be formed from a conductive material such as copper, aluminum, gold, a metal allow, other metals, or other similar materials. In some embodiments, the vias 308 can be filled with conductive material to form the vertical interconnects. After the conductive layer 340 has been formed it can be dried before further use.

The form dry film layer step 374 can form a dry film layer 356 directly on the conductive layer 340. The dry film layer 356 can be a photomask or similar mask structure for forming traces and other elements on the conductive layer 340.

The form pattern layer step 376 can be used to etch a circuitry pattern 358 on the conductive layer 340 using a photoetching or other similar process. The dry film layer 356 can be exposed and developed to create the circuitry pattern 356 on the conductive layer 340. The circuitry pattern 358 can define the conductive elements such as pads, signal traces, power traces, and other similar elements.

The remove dry film layer step 378 can remove the material of the dry film layer 356 after the circuitry pattern 356 has been formed on the conductive layer 340. The dry film layer 356 can be removed in a variety of ways such at chemical removal, physical removal, or other similar techniques.

After the remove dry film layer step 378 has been completed, the process flow can pass back to the form dielectric layer step 368 to process additional layers as needed.

FIG. 3C illustrates another example embodiment of the mounting substrate 302 in the form core conductive layer step 366. The mounting substrate 302 is an electromechnaical structure for routing and transferring signals and power to components coupled to the mounting substrate 302.

In some embodiments, the mounting substrate 302 can be formed by prepping the core layer 330. For example, in a double-sided configuration, the prepping process can include forming conductive layers 340 on the top side and the bottom sides of the core layer 330. The conductive layers 340, such as core conductive layers, can include a top core conductive layer and a bottom core conductive layer. The core layer 330 forms the base of the mounting substrate 302 and can be formed from a dielectric material. In some embodiments, the dielectric material can be CA-832NSF and the core layer 330 can have a thickness of 0.2 mm. The conductive layers 340 can be formed from materials such as copper, copper alloys, aluminum, gold, or other conductive materials.

After prepping the core layer 330, the conductive layer 340 can be etched to form signal and power traces 336, reference shields 350, and other surface treatments on one or both sides of the core layer 330. In some embodiments, the etching process can be a photoetching process using a core conductive layer mask (not shown). Further, vias 308 can be formed in the core layer 330 to provide electrical connectivity to the traces 336 on opposite sides of the core layer 330. The core layer 330 can include the void 346 with a portion of the interlocking shield structure 348. The void 346 is a volume of the core layer 330 that is free of conductive materials. The void 346 can have a variety of shapes including sections that are rectangular, cubic, or a combination thereof.

FIG. 3D illustrates another example embodiment of the mounting substrate 302 in the form conductive layer step 372. The mounting substrate 302 can be formed in a series of steps to form and configure each of the layers 306.

In some embodiments, the next manufacturing step can include forming a dielectric layer 352 on both sides of the core layer 330. The dielectric layer 352 can be formed from a dielectric material 354 such as GL102 or other similar materials. Once the dielectric material 354 has been applied to the core layer 330 it can be cured using heat in an oven.

After the dielectric layer 352 has been cured, the vias 308 can be formed in the dielectric material 354. The drilling operation can be performed in a variety of ways such as laser drilling, mechanical drilling, etching, or other similar techniques.

After the vias 308 have been forming in the dielectric layer 352, a second plating step can form another conductive layer 340 of copper plating over the dielectric layer 352. The copper plating can be formed and dried to prepare for further operations. In an illustrative example, an upper portion of the interlocking shield structure 348 is shown on the conductive layer 340 although in some embodiments it can be formed later at a later step the process.

FIG. 3E illustrates another example embodiment of the mounting substrate 302 in the form pattern step 376. Dry film layers 356 can be formed over the outermost conductive layers 340 to protect the conductive layers 340 during the etching and patterning step. The dry film layers 356 can be formed with a dry film laminate. The dry film layers 356 are photosensitive layers for forming the patterns used to form the layout of the package.

The dry film layers 356 can be patterned using a photolithographic process to form the pattern for the traces and other surface elements on the conductive layer 340. The dry film layer 356 can then be exposed to form and develop the conductive elements, such as pads, traces, and other surface conductive elements.

FIG. 3F illustrates another embodiment of the mounting substrate 302 in the remove dry file step 378. After the conductive layer 340 has been patterned using the dry film layers 356, the dry film layer 356 can be removed.

The mounting substrate 302 can include the core layer 330, one or more of the conductive layers 352, one or more of the dielectric layers 356, a top layer 326, and a bottom layer 328. The core layer 330 can have the void 346 and the interlocking shield structure 348. The mounting substrate 302 can include the vias 336 that can span one or more of the layers 306. After the remove dry film step 378 is completed, the process of forming and patterning the conductive layers 340 can be repeated for every additional layer pair. When all the additional layer pairs have been formed, the solder mask layer 326 can be formed on the top layer and the bottom solder mask layer 328 can be formed on the bottom layer of the mounting substrate 302. top solder mask layer 326 over the first layer 310 and a bottom solder mask layer 328.

Figures 4A, 4B, 4C:
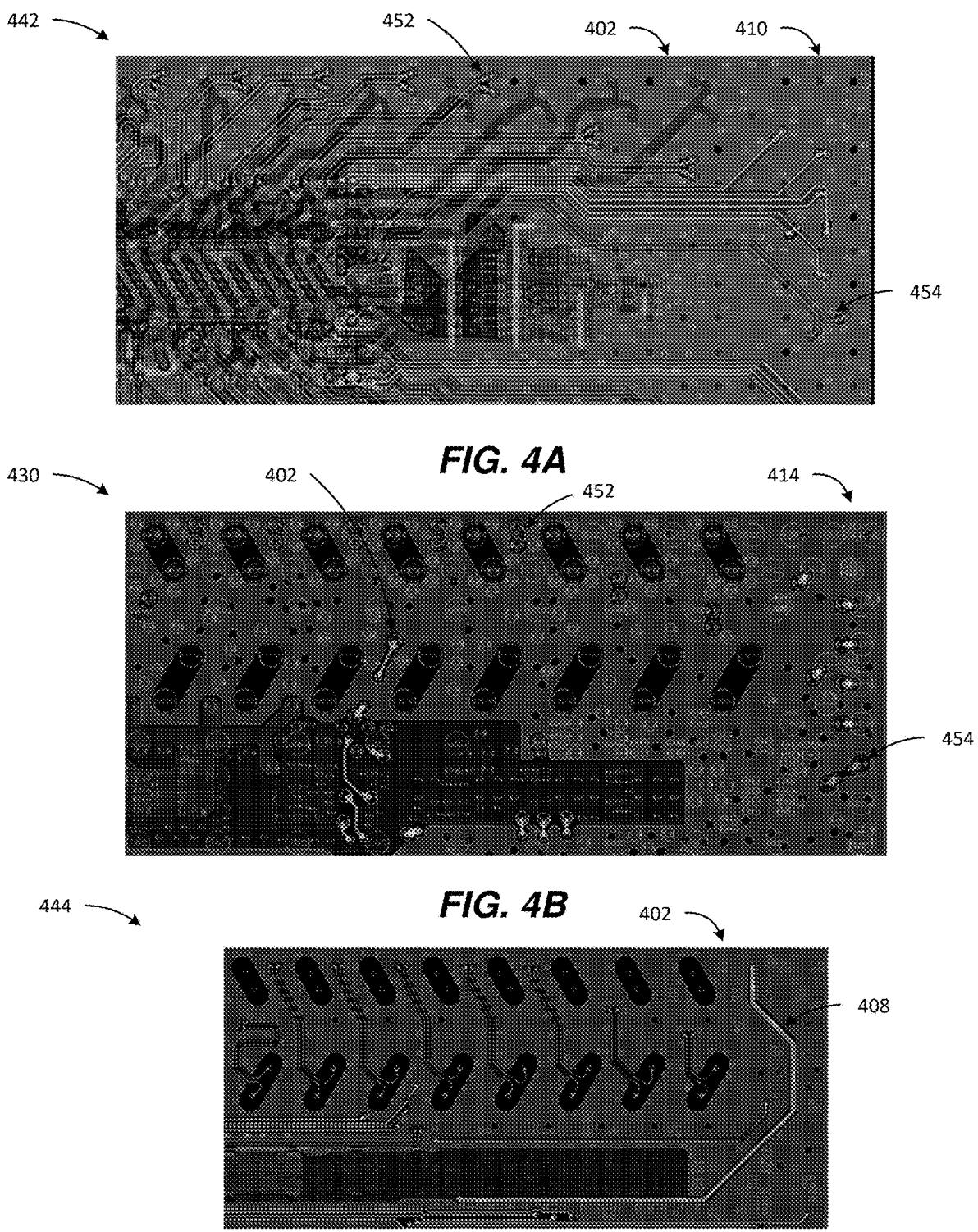
FIG. 4A depicts an example embodiment of a top view of a top layer of a mounting substrate.
FIG. 4B depicts an example embodiment of a core layer of a mounting substrate.
FIG. 4C depicts an example embodiment of a view of a lower layer of the mounting substrate.

FIGS. 4A, 4B and 4C illustrate example embodiments of layers 406 of a mounting substrate 402. Each of the layers 406 can provide different functionality and different electrical connectivity between the layers of the mounting substrate 402.

FIG. 4A illustrates an example embodiment of a top view of a top layer 442 of the mounting substrate 402. The top layer 442 can show the transmission and receiving breakout and routing of the signal traces of the RX channel 452 and the TX channel 454 on the mounting substrate 402. The layers can show the receiving and transmission breakout and routing on the top or upper layers, including a first layer 410 and a third layer 414.

FIG. 4B illustrates an example embodiment of a core layer of the mounting substrate 402. The core layer 430 can show the trace routing between vias receiving and transmission breakout and routing on the top or upper layers.

In some embodiments, the core layer 430 can include vias 432. The vias 432 are vertical interconnects that can be configured to route signals and power between different layers. The vias 432 can include plating through hole (PTH) vias, non-plating through hole vias, through board vias, internal vias, blind vias, stacked vias, staggered vias, buried vias, or other similar types of vertical interconnects.

In other embodiments, the vias 432 can be used to transfer serial data signals for the RX channel 452 and the TX channel 454. The RX channel vias and the TX channel vias can be located in relatively close proximity. However, this may impact the level of crosstalk interference.

FIG. 4C illustrates an example embodiment of a view of a lower layer 444 of the mounting substrate 402. The lower layer 444 can show the trace routing to reach the mounting pads of a component attached to the mounting substrate 402, such as a ball grid array package. In some embodiments, the lower layer 444 can be a layer one above the bottom layer, such as layer 7 in an 8-layer mounting substrate. In some other embodiments, the signal traces for the RX channel 452 and the TX channel 454 on the lower layer 444 can be configured to be separated by a distance calculated to reduce crosstalk interference with other traces. The signal traces for the RX channel 452 and the TX channel 454 can be configured to reach an electronic component on the mounting substrate 402, such as a ball grid array component.

Figure 5:
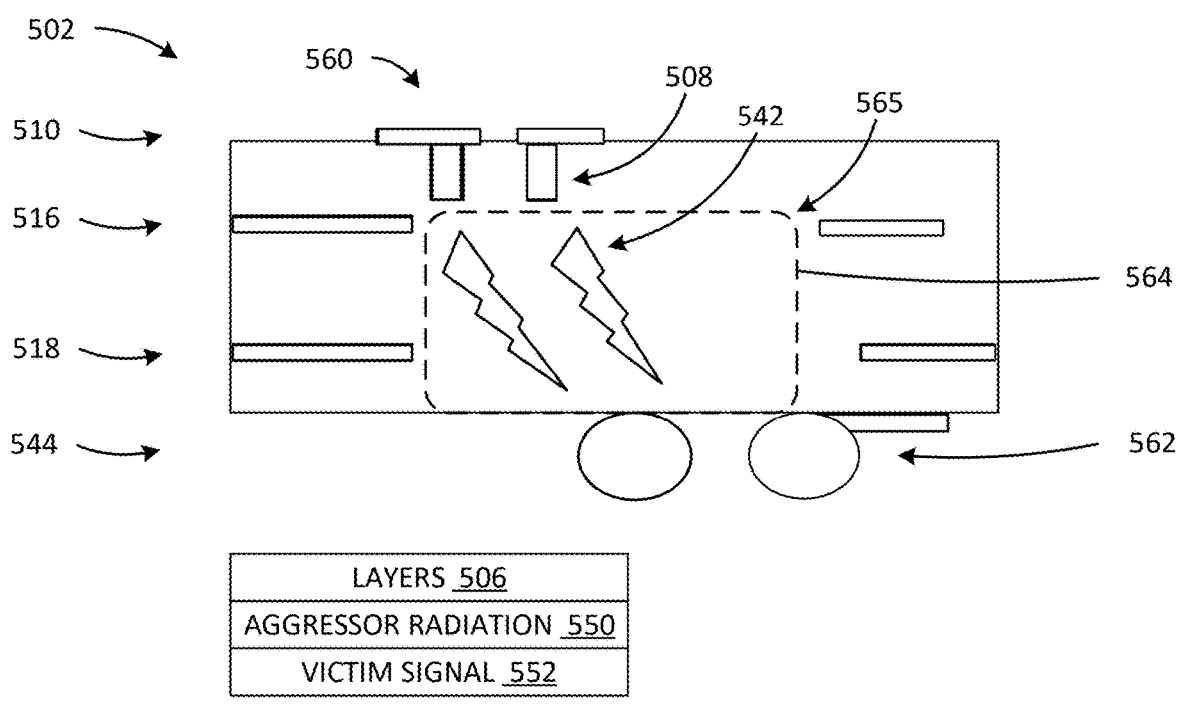
FIG. 5 depicts another example embodiment of a mounting substrate.

FIG. 5 illustrates another example embodiment of a mounting substrate 502. The mounting substrate 502 can include multiple layers 506 with capacitor pads 560 coupled to vias 508 extending between the layers 506. The mounting substrate 502 can exhibit electrical crosstalk between the vias 508 and other conductive elements, such as solder balls 562.

In an embodiment, the mounting substrate 502 can include the capacitor pads 560 electrically coupled to one or more of the vias 508. The mounting substrate 502 can include different layers, such as a first layer 510, a fourth layer 516, and a fifth layer 518, The mounting substrate 502 can be configured with a void 564 formed below the vias 508. The void 564, such as a void volume 565, is a shaped volume of a layer that is substantially free of conductive material. The void volume 565 can be an unplated area within the dielectric material of the layer.

The void 564 can extend for one or more of the layers 506. The void 564 is a volume of the mounting substrate 502 that is substantially free of conductive materials. The void 564 can be formed in a variety of ways. For example, the void 564 can be formed by design, omitting conductive elements within the void 564, etching traces along the outside of the void, drilling to form voids around the outside of the void, ablation to remove conductive material between layers for multi-layer voids, plating elements around the outside of the void, or other similar techniques.

The presence of the void 564 can increase the level of crosstalk interference with other elements attached to the mounting substrate 502. For example, the mounting substrate 562 can include solder balls 562 attached on a bottom layer 544 of the mounting substrate 562. The configuration of the capacitor pads 560 attached to the vias 508 with both positioned above the void 564 and the solder balls 562 positioned below the void 564 can be susceptible to crosstalk interference 542. The presence of the void 564 can provide a free pathway for coupling between the capacitor pads 560 and the vias 508 with the solder balls 562, such as BGA solder balls. The capacitor pads 560 and the vias 508 can be a source of aggressor radiation 550, while the solder balls 562 can be the recipient of the crosstalk interference, such as a victim signal 552. Because there is nothing to impede the coupling, significant crosstalk interference 542 can occur between the two elements.

Figure 6:
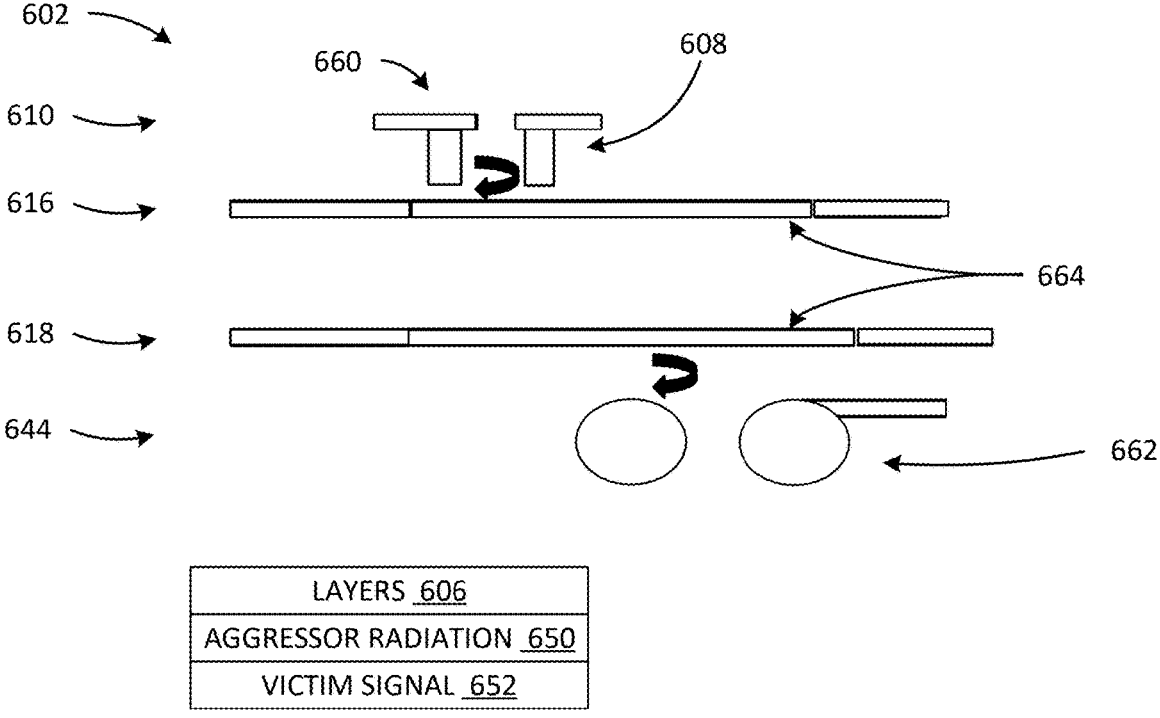
FIG. 6 depicts yet another example embodiment of a mounting substrate.

FIG. 6 illustrates yet another example embodiment of a mounting substrate 602. The mounting substrate 602 can include multiple layers 606 with capacitor pads 660 coupled to vias 608 extending between the layers 606. The mounting substrate 602 can exhibit electrical crosstalk between the vias 608 and other conductive elements, such as solder balls 662.

In some embodiments, the mounting substrate 602 can include the capacitor pads 660 electrically coupled to one or more of the vias 608. The mounting substrate 602 can be configured with one or more ground shields 664 formed on other layers below the vias 608. The ground shields 664 are conductive elements that can reduce crosstalk. The ground shields 664 can be electrically coupled to a ground line. The mounting substrate 602 can include different layers, such as a first layer 610, a fourth layer 616, and a fifth layer 618, The ground shields 664 can be formed in a variety of ways. For example, the ground shields 664 can be formed by deposition, plating, etching, milling, or other similar techniques.

The presence of ground shields 664 can reduce the level of crosstalk interference with other elements attached to the mounting substrate 602. For example, the mounting substrate 662 can include the solder balls 662 attached on a bottom layer 644 of the mounting substrate 662. The ground shields 664 can be positioned below the capacitor pads 660 and the vias 608 and above the solder balls 662, such as BGA balls. The capacitor pads 660 and the vias 608 can be a source of aggressor radiation 650, while the solder balls 662 can be the recipient of the crosstalk interference, such as a victim signal 652. However, the use of the ground shields 664 can cause increased return loss resulting in lower performance.

Figure 7:
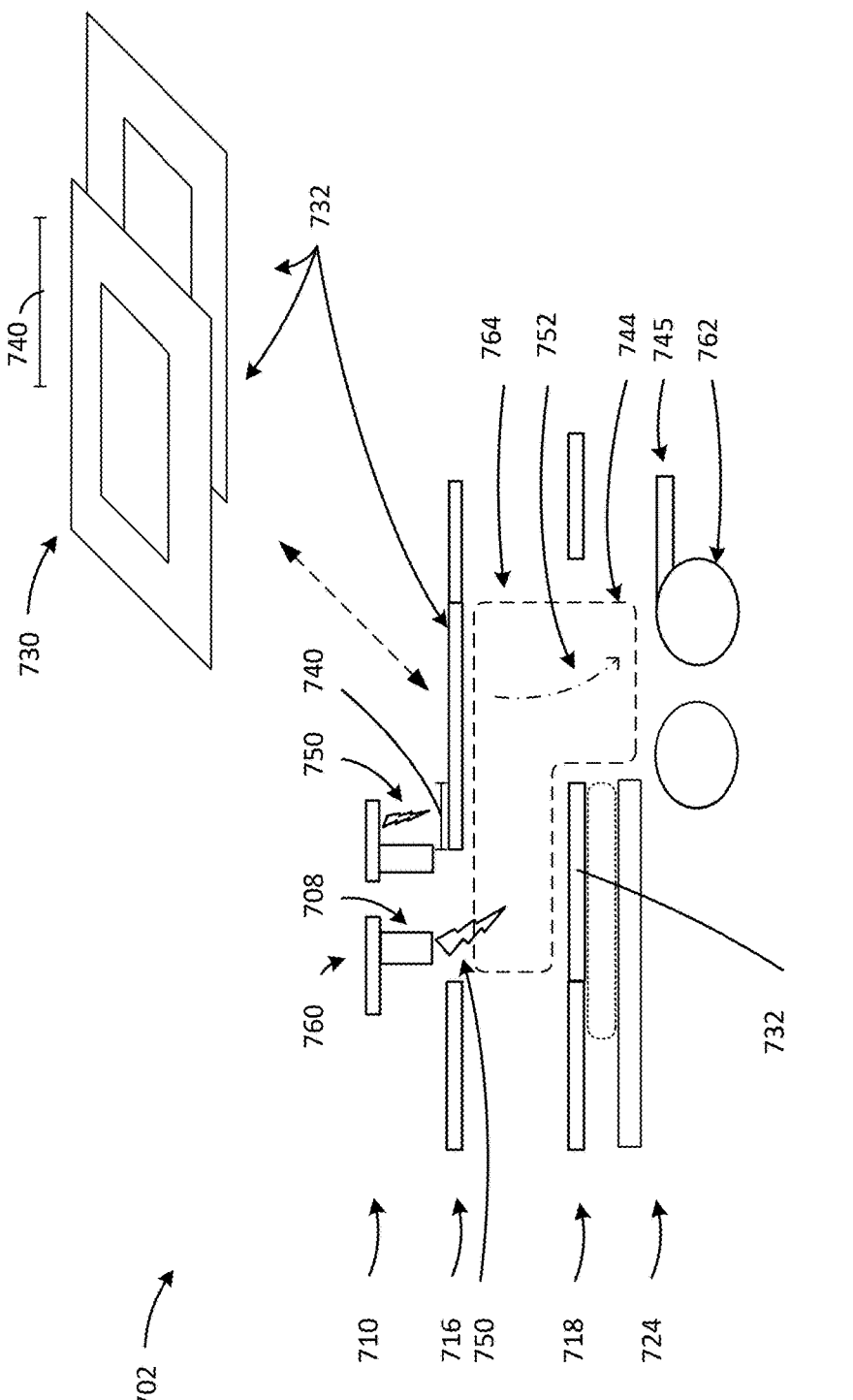
FIG. 7 depicts an example embodiment of a zipper structure of a mounting substrate.

FIG. 7 illustrates an example embodiment of a zipper structure 730 of a mounting substrate 702. The zipper structure 730 is a multilayer structure with reference shields 732. The zipper structure 730 can be configured as an interlocking shielding structure for reducing electromagnetic interference. The terms zipper structure, interlocking zipper structure, and interlocking shielding structure can be used interchangeably. The reference shields 732 can be configured as conductive elements electrically coupled to an electrical ground to reduce electromagnetic radiation interference.

In some embodiments, the reference shields 732 can be configured to be interlocking reference shields, overlapping reference shields, offset reference shields, or a combination thereof. The term zipper structure can include elements that are interlocking, overlapping, or a combination thereof with reference to other elements in the structure. In yet other embodiments, the zipper structure 730 can be similar to a mechanical zipper with the individual elements making up the structure configured to provide the equivalent of a continuous conductive shield element when viewed from the perspective of another electrical element. For example, the zipper structure can form an effectively continuous conductive shield between a via and pad on one side of a void and the solder balls on the other side of the void.

In some embodiments, the mounting substrate 702 can have multiple layers 706 with capacitor pads 760 on a top side, vias 708 electrically coupled to the capacitor pads 760, and solder balls 762 on a bottom side. The mounting substrate 702 can have the zipper structure 730 positioned between the vias 708 and solder balls 762. In an illustrative example, the mounting substrate 702 can have the capacitor pads 760 exposed on a first layer 710, the vias 708 extending between the first layer 710 and a fourth layer 716, a fifth layer 718, and the solder balls 762 attached to an eighth layer 724 from below. The capacitor pads 760 and the vias 708 can be a source of aggressor radiation 750 and the solder balls 762 can receive a victim signal 752 resulting from the aggressor radiation 750.

The zipper structure 730 can be a set of two or more of the reference shields 732 that overlap one another in an interlocking configuration when viewed along a line of sight between the top pad and vias and the bottom solder balls. Each of the reference shields 732 can be on different levels of the mounting substrate 702. In some configurations the zipper structure 730 can include three or more of the reference shields 732. In other embodiments, the zipper structure 730 can have a complete overlap or a partial overlap expressed as a degree of overlapping. The degree of overlapping can be expressed as a percentage of the total area of the overlapping portion compared to the surface area of one of the reference shield 732 or the total of both of the reference shields 732. In some other embodiments, the interlocking reference shield 732 can be close to one another with no overlap.

In some embodiments, the zipper structure 730 can have a different number of the reference shields 732. For example, the zipper structure 730 can be formed with multiples of the reference shields 732, such as the zipper structure 730 formed by overlapping and interlocking three or more of the reference shields 732, each on different layers. In other embodiments, the zipper structure 730 can have two of the reference shields 732 configured to block the line of sight between the top pad and vias and the bottom solder balls 762.

The reference shields 732 are conductive elements that can reduce crosstalk interference from the aggressor radiation components that can be a source of crosstalk interference. The reference shields 732 can be electrically coupled to a system ground.

The reference shields 732 can be configured to be within a shield volume 744. The shield volume 744 can be a combination of a void 764 and the reference shields 732 positioned adjacent to the void 764. The void 764, such as a void volume, is a volume within the dielectric material of the layer that is substantially free of conductive materials including traces, vias, pads, or other structures. The void 764 can be an unplated area of the layer. The void 764 can be formed by the non-conductive volume between the upper conductive structure and the lower conductive structure. The void 764 can have a variety of shapes. For example, the void 764 can be a regular geometric shape such as a rectangular volume, it can be a complex shape formed by combining two or more other shape volumes, an irregular shape formed by volume resulting from multiple conductive elements around the void, a rounded or pill shaped volume, or a combination thereof. In another illustrative example, the void 764 can be the result of two rectangular volumes directly adjacent or intersection one another to form an "L" shaped volume.

The zipper structure 730 can overlap one another by a shield overlap 740 that indicates how much the two reference shields 732 overlap. In some embodiments, the shield overlap 740 can indicate a distance two regularly shaped reference shields 732 overlap, such as an overlap distance.

In other embodiments, the shield overlap 740 can represent an area, such as an overlap area. The overlap area can be calculated in different ways. For example, the overlap area can be calculated as the overlap area of the two reference shields 732 compared to the total area of the two reference shields 732. Alternatively, the overlap area can be calculated as the overlap area of the two reference shields 732 as compared to one of the reference shields 732.

The reference shields 732 of the zipper structure 730 can have a variety of shapes. The reference shield 732 can be rectangular, square, round, pill-shaped, regular, irregular, or other shapes. In some embodiments, each of the reference shields 732 can have different shapes and sizes. For example, the reference shields 732 can have shapes that interlock horizontally with portions of one of the other reference shields 732. In other embodiments, the reference shields 732 can have complex shapes including having multiple segments, having one or more openings of different shapes in the reference shields 732, or a combination thereof.

In some embodiments, the reference shields 732 of the zipper structure 730 can be aligned with one another along a major or minor axis of the shape of the reference shield 732 and overlapping one another by the shield overlap 740. In other embodiments, the reference shields 732 can be aligned in an irregular fashion based on the available and unused areas of the individual layers.

The reference shields 732 of the zipper structure 730 can have different vertical offsets and can be vertically separated by one or more layers. For example, each of the reference shields 732 can be on adjacent layers or separated by a larger number of layers. In some embodiments, the reference shields 732 can be configured with two or more of the reference shields 732 on one layer and one or more of the reference shields on another layer.

In some embodiments, the zipper structure 730 can be positioned between the vias 708 and the solder balls 762 to reduce the degree of direct line of sight of a path between the two elements through the void 764. Depending on the configuration, the zipper structure 730 can eliminate the direct line of sight between the two elements within the void 762. It is understood that the void 762 can include portions of the reference shields 732 of the zipper structure 730.

The reference shields 732 can be formed in a variety of ways. For example, the reference shields 732 can be formed by deposition, plating, etching, milling, or other similar techniques.

The presence of the reference shields 732 can provide an electromagnetic interference (EMI) shielding effect that can reduce the level of crosstalk interference with other elements attached to the mounting substrate 702. For example, the mounting substrate 762 can include the solder balls 762 attached on a bottom layer 744 of the mounting substrate 762. The reference shields 732 can be positioned below the capacitor pads 760 and the vias 708 and above the solder balls 762, such as BGA balls. The capacitor pads 760 and the vias 708 can be a source of aggressor radiation 750, while the solder balls 762 can be the recipient of the crosstalk electromagnetic interference, such as a victim signal 752. The aggressor radiation 750 can be electromagnetic interference generated by and radiated from a conductive structure such as the capacitor pads 76 and the vias 708. The victim signal 752 is an electrical interference signal received in a recipient conductive structure such as the solder balls 762. The use of the reference shields 732 can provide for improved return loss performance. The combination of the reference shields 732 can be configured to block the line of sight between the top conductor structure and the bottom conductive structure to reduce electromagnetic interference and crosstalk.

FIGS. 8A, 8B, 8C, and 8D illustrate example embodiments of layers 806 of a mounting substrate 802. Each of the layers 806 can provide different functionality and different electrical connectivity between the layers of the mounting substrate 802.

FIG. 8A illustrates an example embodiment of a layer view of a mounting substrate 802. The layer view shows the positioning of a first void 866 and a second void 868.

The first reference shield 870 is located directly over the first void 866. The second reference shield 872 is located directly over the second void 868.

In some embodiments, the first void 866 can be formed on a fourth layer 816 of the mounting substrate 802. The first void 866 can be pill shaped, rectangular, oval, or other similar shapes. The first void 866 be trimmed to half of a component, such as a BGA, on a pin closer to vias such as a transmission capacitor via.

The second void 868 can be formed on a fifth layer 818 of the mounting substrate 802. The second void 868 can be a rectangular cap void with a substantially rectangular shape. The second void 868 can be configured to hug the cut back of the first void 866, such as a pill void cut. From the vertical perspective, the first void 866 and the second void 868 overlap each other to form a zipper structure 830.

FIG. 8B illustrates an example embodiment of a fourth layer 816 of the mounting substrate 802. The fourth layer 816 can include the second reference shield 872 over the second void 868. The void can be used to compensate for unwanted capacitance to improve the return loss.

FIG. 8C illustrates an example embodiment of a fifth layer 818 of the mounting substrate 802. The fifth layer 818 can include the first reference shield 870 over the first void 866. The first void 866 can be used to compensate for unwanted capacitance to improve return loss.

FIG. 8D illustrates an example embodiment of the zipper structure 830 of the mounting substrate 802. The zipper structure 830 can include the first reference shield 870 over and overlapping with the second reference shield 872.

Figure 9A:
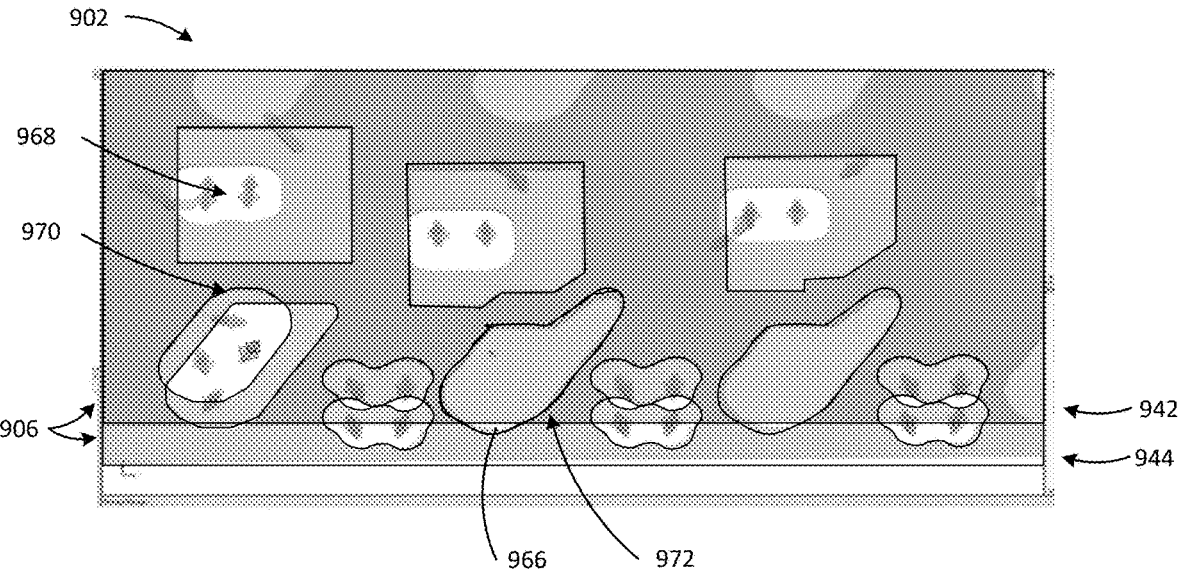
FIG. 9A depicts an example of layers of a mounting substrate.
Figure 9B:
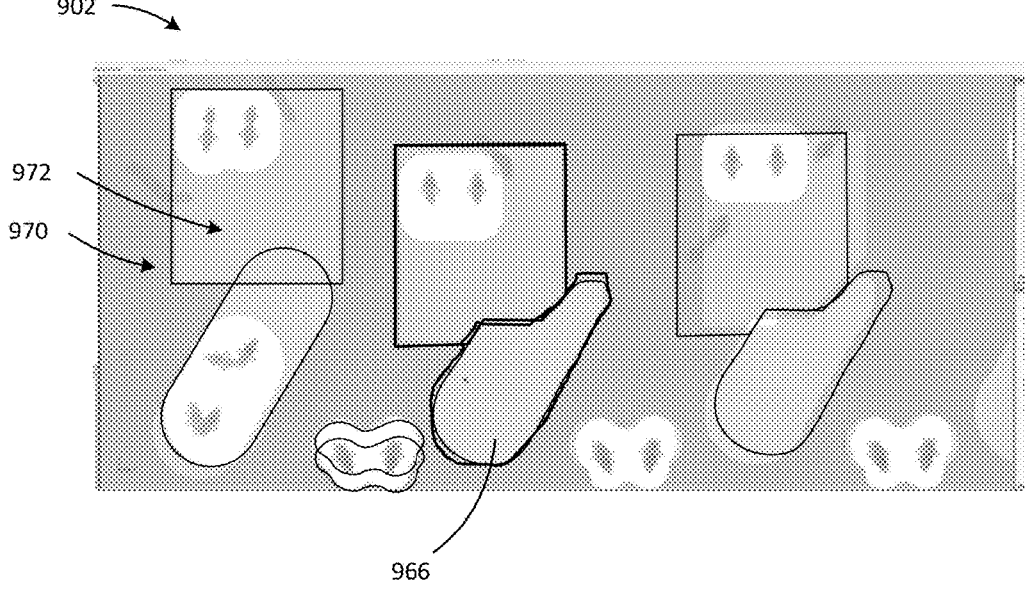
FIG. 9B depicts an example of a top view of a mounting substrate.

FIGS. 9A and 9B illustrate example embodiments of layers 906 of a mounting substrate 902. Each of the layers 906 can provide different functionality and different electrical connectivity between the layers of the mounting substrate 902.

FIG. 9A illustrates an example embodiment of a cross-sectional view of two overlapping layers 906 of a mounting substrate 902. The cross-sectional view shows the relative positions of the elements with the two layers 906 viewed at an angle to show both layers 906.

The mounting substrate 902 can include an upper layer 942 positioned over a lower layer 944. The upper layer 942 can include a first void 966 and a first reference shield 970. The lower layer 944 can include a second void 968 and a second reference shield 972. In some embodiments, the first void 966 can include a cap void and the second void 968 can include a BGA void.

The view shows the positioning of the first void 966 relative to the second void 968. The angle of the view shows the elements of the upper layer 942 are above the lower layer 944.

FIG. 9B illustrates an example embodiment of a top view of the mounting substrate 902. The top view shows the position of the elements in a vertical perspective. The first void 966 can be above a portion of the second void 968. The first reference shield 970 can overlap the second reference shield 972.

Figure 10:
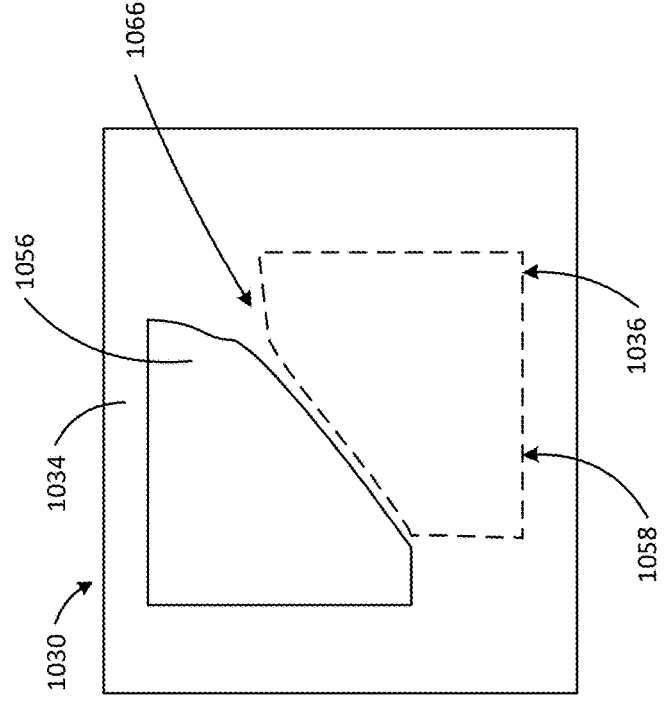
FIG. 10 depicts an example of a zipper structure of a mounting substrate.

FIG. 10 illustrates an example embodiment of a zipper structure 1030 of a mounting substrate 1002. The zipper structure 1030 is formed from two or more voids configured with reference shields 1032 that can overlap or be distinct.

An upper layer 1042 can include an upper void 1056, such as an receive void (RX void) and an upper reference shield 1034. A lower layer 1044 can include a lower void 1058, such as a transmission void (TX void), and a lower reference shield 1072.

In some embodiments, the upper void 1056 and the lower void 1058 can be formed in an overlapping configuration. In other embodiments, the upper void 1056 and the lower void 1058 can be configured to trim the overlap portion of the voids to prevent the overlaps and create a ground reference channel 1066 between the two voids. In an example, the ground reference channel 1066 can be the horizontal separation between the two voids that are formed on the different layers.

The two reference shields can form the zipper structure 1030, such as an interlocking reference shield structure. This structure can significantly reduce the crosstalk interference 1054 between a receive channel 1074, such as a receive lane, and a transmission channel 1076, such as a transmission lane. The configuration can show that the resonance peaks in the crosstalk interference can be optimized.

In some embodiments, the upper reference shield 1034 and the lower reference shield 1036 can overlap one another vertically. The amount of overlap can be measured using an overlap area 1068. The overlap area 1068 is the amount of overlap between the upper reference shield 1034 and the lower reference shield 1036. The overlap area 1068 can be value including a percentage, a length, a numerical value, or a combination thereof.

3.0. Performance Analysis

Figure 11:
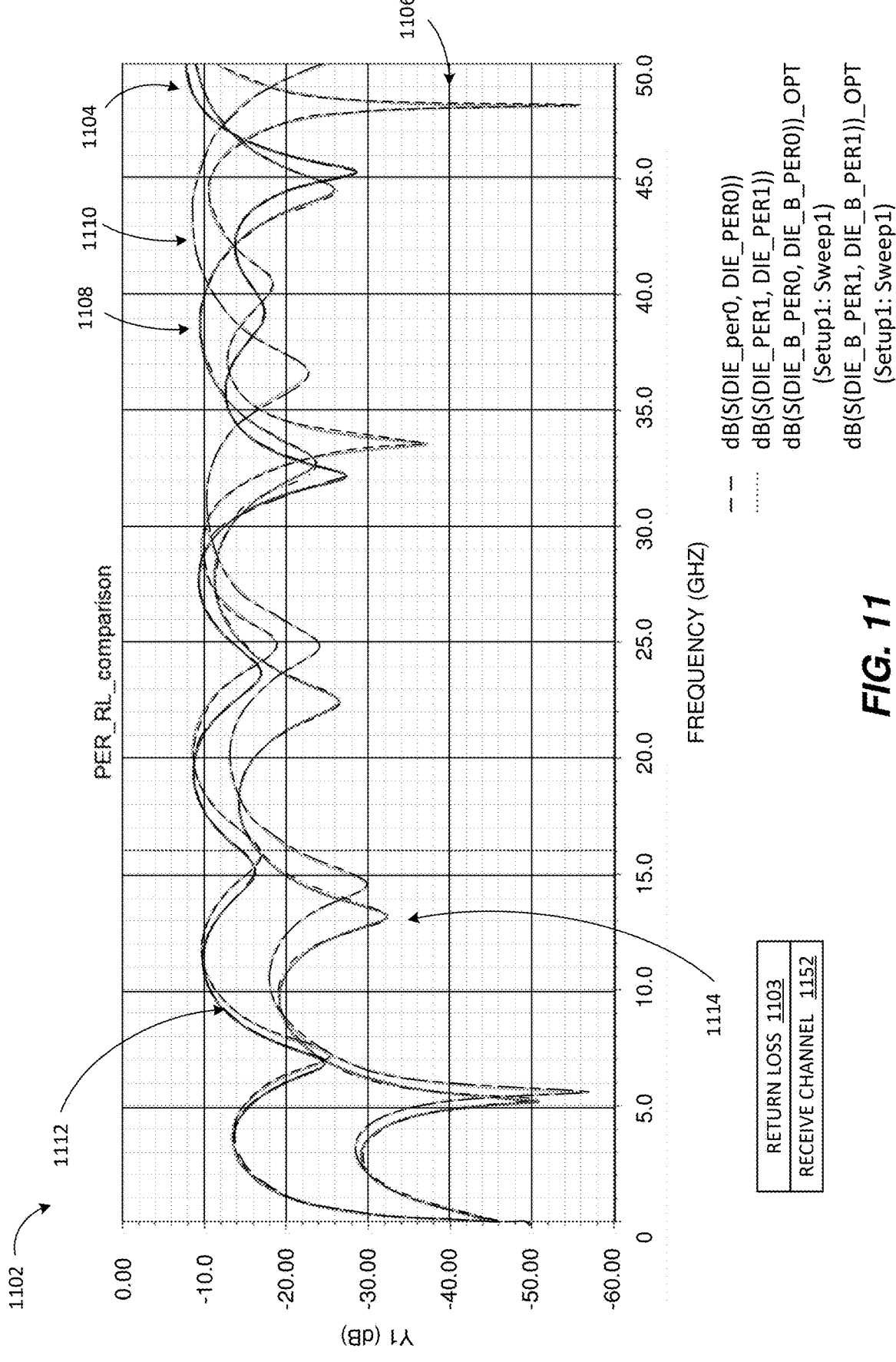
FIG. 11 depicts an example of a return loss graph for an embodiment of the electronic system.

FIG. 11 illustrates an example of a return loss graph 1102 for an embodiment of the electronic system 100. The return loss graph 1102 shows return loss 1104 for an electrical signal loss in decibels over a range of frequencies for a receive channel 1152.

The return loss graph 1102 can show the amount of signal power reflected back to the source along an electrical element. A higher value of the return loss 1104 shows lower reflection and better signal and power transmission. The return loss 1104 can be expressed as the logarithmic ratio of the power reflected back along the electrical element.

In some embodiments, the return loss graph 1102 can show the return loss 1104 for different configurations. The return loss graph 1102 can show an optimized return loss at approximately 13 GHz with the return loss at approximately –32 dB.

The return loss graph 1102 shows separate curves for different configuration. For example, the first curve 1104 can represent the return loss of a die PER0. The second curve 1106 can represent the return loss of a die PER1. The third curve 1108 can represent the return loss of a die B_PER0. And the fourth curves 1110 can represent the return loss of a die B_PER1.

In some embodiments, the first curve 1104 can have a value of –14.42 at 16 GHz. The second curve 1106 can have a value of –16.77 at 16 GHz. The third curve 1108 can have a value of –16.54 at 16 GHz. The fourth curve 1110 can have a value of –21.02 at 16 GHz. The return loss graph 1102 can include an old curve 1112 and an after curve 1114. The after curve 114 can show the optimized response.

Figure 12:
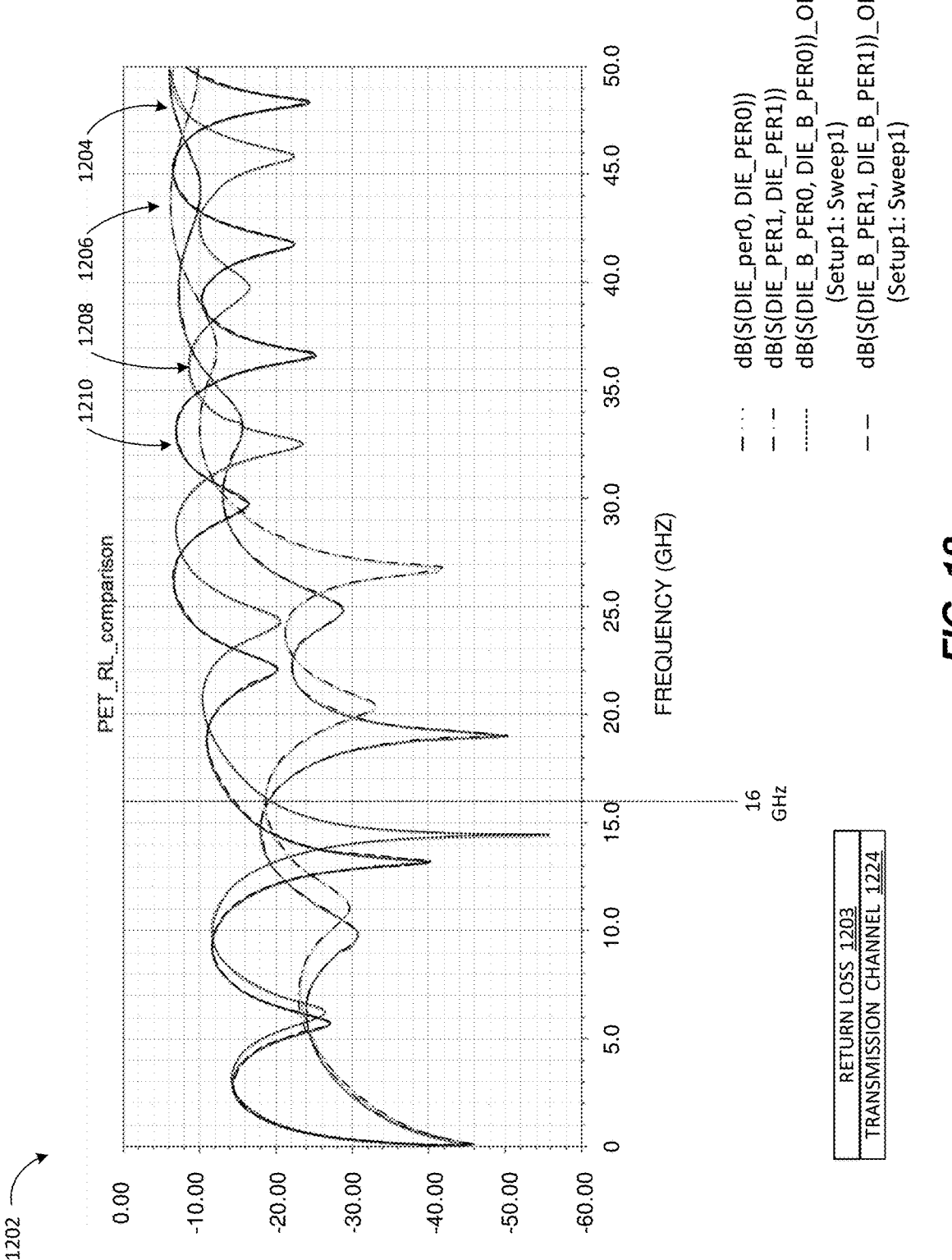
FIG. 12 depicts another example of a return loss graph for an embodiment of the electronic system.

FIG. 12 illustrates another example of a return loss graph 1202 for an embodiment of the electronic system 100. The return loss graph 1202 shows return loss 1203 for an electrical signal loss in decibels over a range of frequencies for the transmission channel 1224.

The return loss graph 1202 can show the amount of signal power reflected back to the source along an electrical element. A higher value of the return loss 1204 shows lower reflection and better signal and power transmission. The return loss 1204 can be expressed as the logarithmic ratio of the power reflected back along the electrical element.

In an exemplary embodiments, the return loss graph 1202 can show the return loss 1203 for different configurations. The return loss graph 1202 can show an optimized return loss at approximately 11 GHz with the return loss at approximately-32 dB.

The return loss graph 1202 shows separate curves for different configuration. For example, the first curve 1204 can represent the return loss of a die A PET0. The second curve 1206 can represent the return loss of a die A PET1. The third curve 1208 can represent the return loss of a die PET1. And the fourth curves 1210 can represent the return loss of a die PER0.

The second curve 1206 can have a value of –18.54 at 16 GHz. The third curve 1208 can have a value of –19.28 at 16 GHz. The fourth curve 1210 can have a value of –14.32 at 16 GHz.

Figure 13:
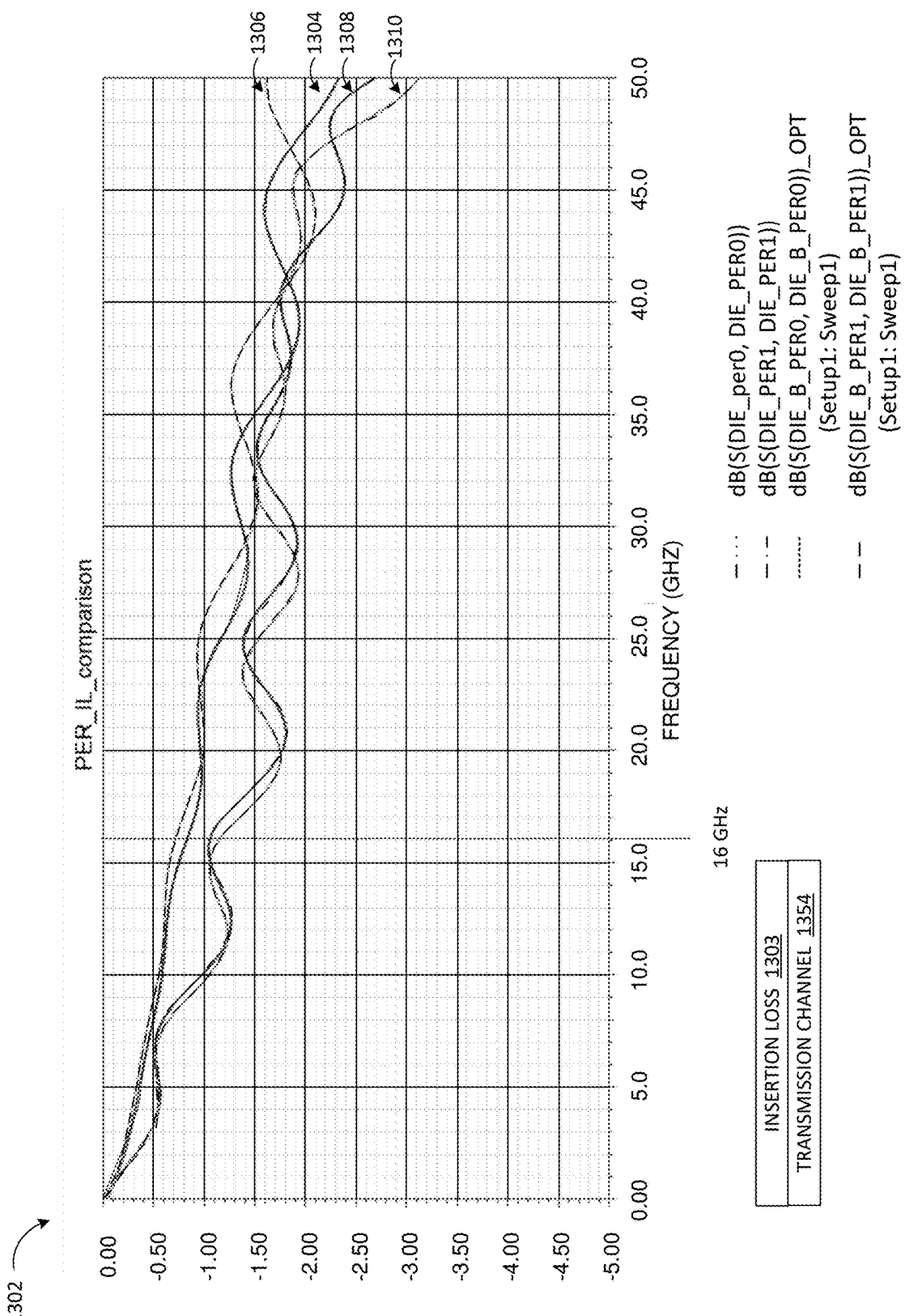
FIG. 13 depicts an example of an insertion loss graph for an embodiment of the electronic system.

FIG. 13 illustrates an example of an insertion loss graph 1302 for an embodiment of the electronic system 100. The insertion loss graph 1302 shows insertion loss 1303 for an electrical signal loss in decibels over a range of frequencies for the transmission channel 1354.

The insertion loss 1303 is the loss of the strength of a signal as it travels along a path between two points, such as a signal moving along a trace or via. The insertion loss 1303 is the logarithmic ratio between the power send and the power received and is expressed in decibels.

The insertion loss graph 1302 shows separate curves for different configurations. For example, the first curve 1304 can represent the insertion loss from the BGA B PER0 to a die B PER0. The second curve 1306 can represent the insertion loss from the BGA B PER1 to a die B PER1. The third curve 1308 can represent the insertion loss from the BGA PER1 to a die PER1. And the fourth curves 1310 can represent the insertion loss from the BGA PER0 to a die PER0.

In one embodiment, the first curve 1304 can have a Y1 value of –0.83 at 16 GHz. The second curve 1306 can have a Y1 value of –0.71 at 16 GHz. The second curve 1306 can have a value of –0.94 at 16 GHz. The third curve 1308 can have a value of –1.05 at 16 GHz. The fourth curve 1310 can have a value of –1.14 at 16 GHz.

Figure 14:
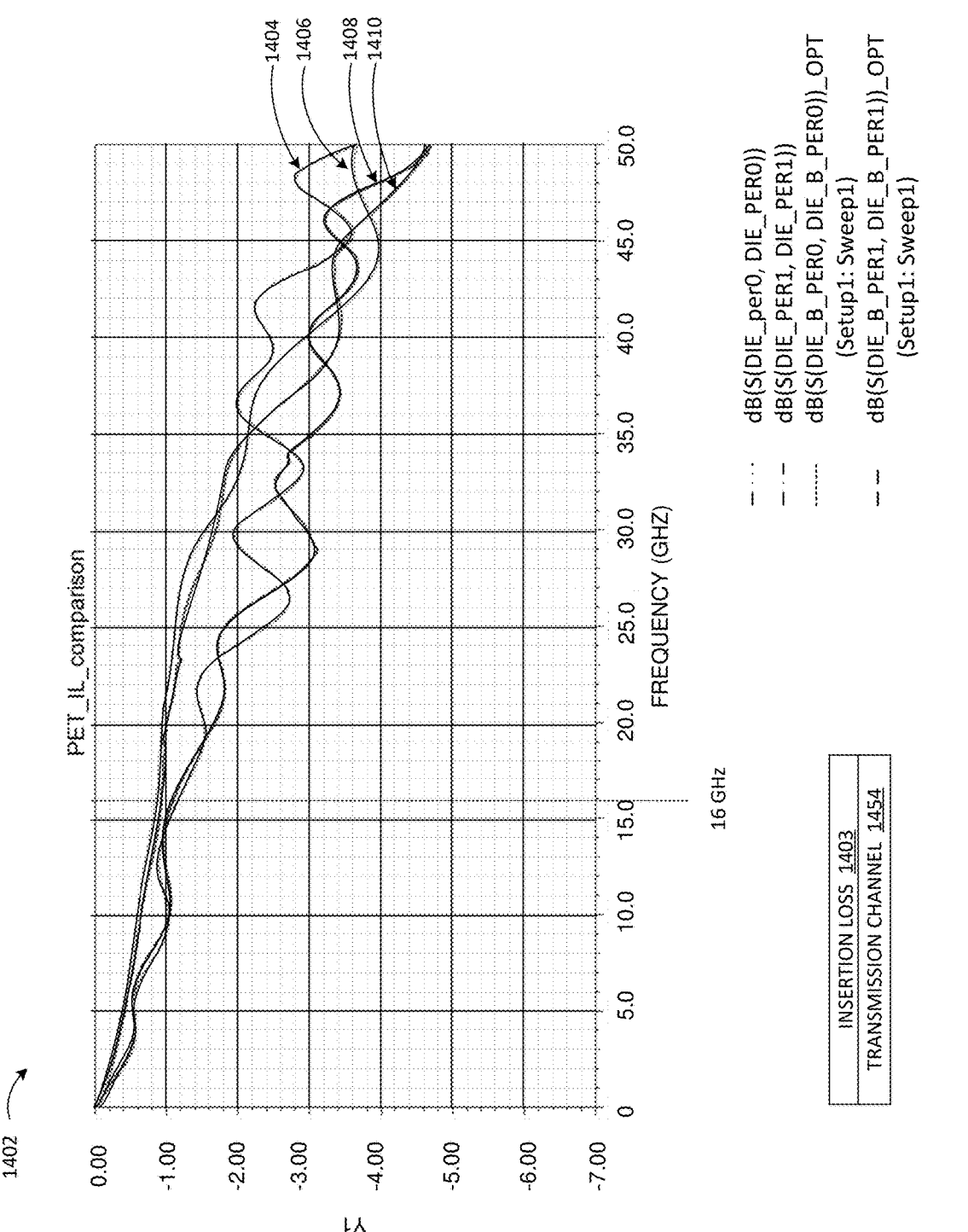
FIG. 14 depicts another example of an insertion loss graph for an embodiment of the electronic system.

FIG. 14 illustrates another example of an insertion loss graph 1402 for an embodiment of the electronic system 100. The insertion loss graph 1402 shows insertion loss 1403 for an electrical signal loss in decibels over a range of frequencies for the transmission channel 1454.

The insertion loss 1403 is the loss of the strength of a signal as it travels along a path between two points, such as a signal moving along a trace or via. The insertion loss 1403 the logarithmic ratio between the power send and the power received and is expressed in decibels.

The insertion loss graph 1402 shows separate curves for different configurations. For example, the first curve 1404 can represent the insertion loss from the BGA A PET0 to a die A PET0. The second curve 1406 can represent the insertion loss from the BGA A PET1 to a die A PET1. The third curve 1408 can represent the insertion loss from the BGA PET0 to a die PET0. And the fourth curves 1410 can represent the insertion loss from the BGA PET1 to a die PET1.

In one embodiment, the first curve 1404 can have a Y1 value of −0.86 at 16 GHZ. The second curve 1406 can have a value of −0.94 at 16 GHz. The third curve 1408 can have a value of −1.17 at 16 GHZ.

Figure 15:
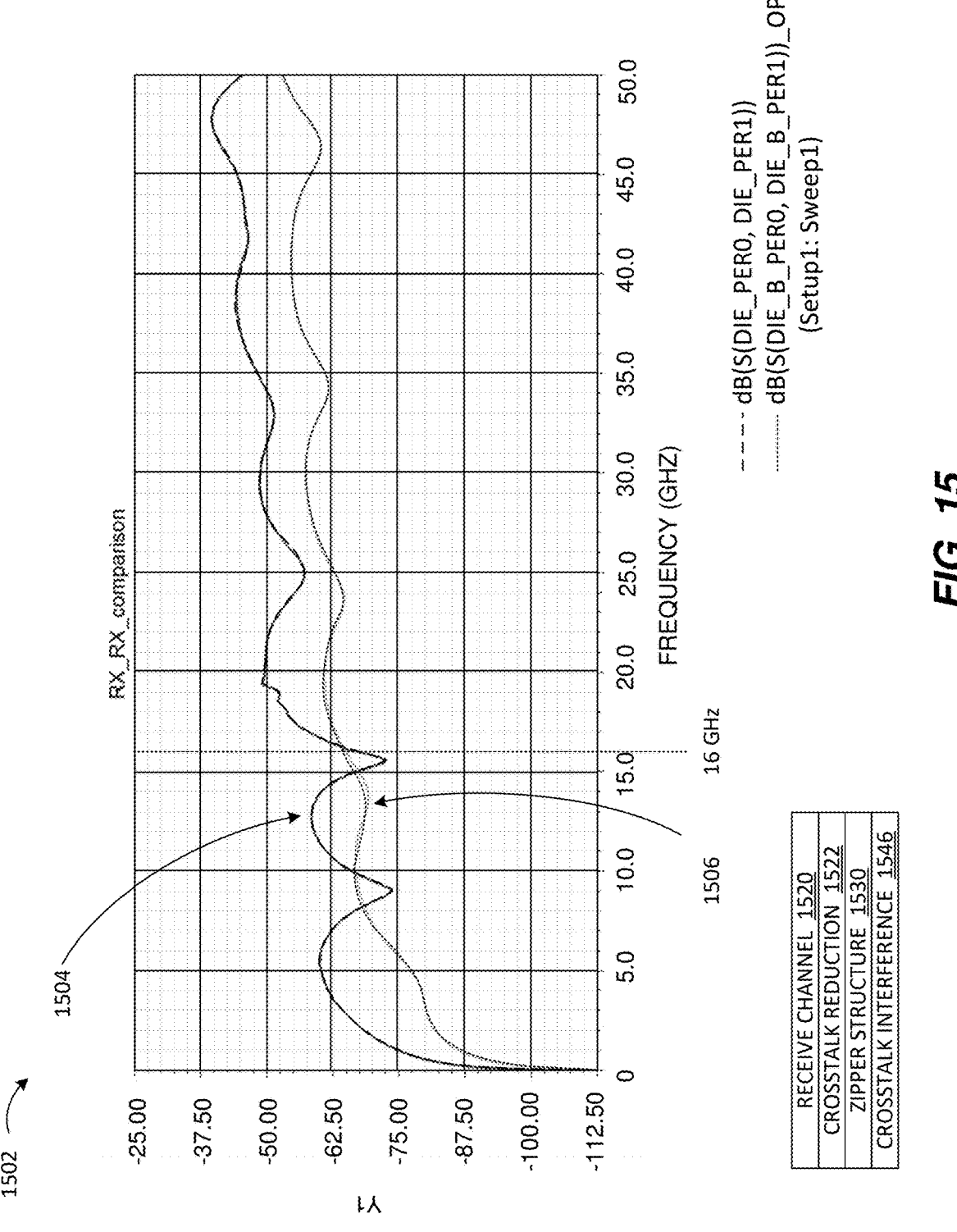
FIG. 15 depicts an example of crosstalk comparison graph for an embodiment of the electronic system.

FIG. 15 illustrates an example of a crosstalk comparison graph 1502 for an embodiment of the electronic system 100. The crosstalk comparison graph 1502 shows a comparison of the crosstalk reduction 1522 along a receive channel 1520 over different configuration and over a range of frequencies.

The crosstalk reduction 1522 is the loss of the strength of a crosstalk interference 1546 between two points, such as a pad, solder ball, trace or via. The crosstalk reduction 1522 can represent the difference in power sent and the power received and is expressed in decibels.

The crosstalk comparison graph 1502 shows separate curves for different configurations. For example, the first curve 1504 can represent the crosstalk reduction 1522 between the die PET0 to a die A PET1. The second curve 1506 can represent the crosstalk reduction 1522 between the die B PET0 to a die B PET1. The first curve 1504 can indicate a "before" configuration and the second curve 1506 can represent the "after" configuration using a zipper structure 1530. In one embodiment, the first curve 1504 can have a Y1 value of −69.99 at 16 GHz. The second curve 1506 can have a Y1 value of −79.41 at 16 GHZ.

Figure 16:
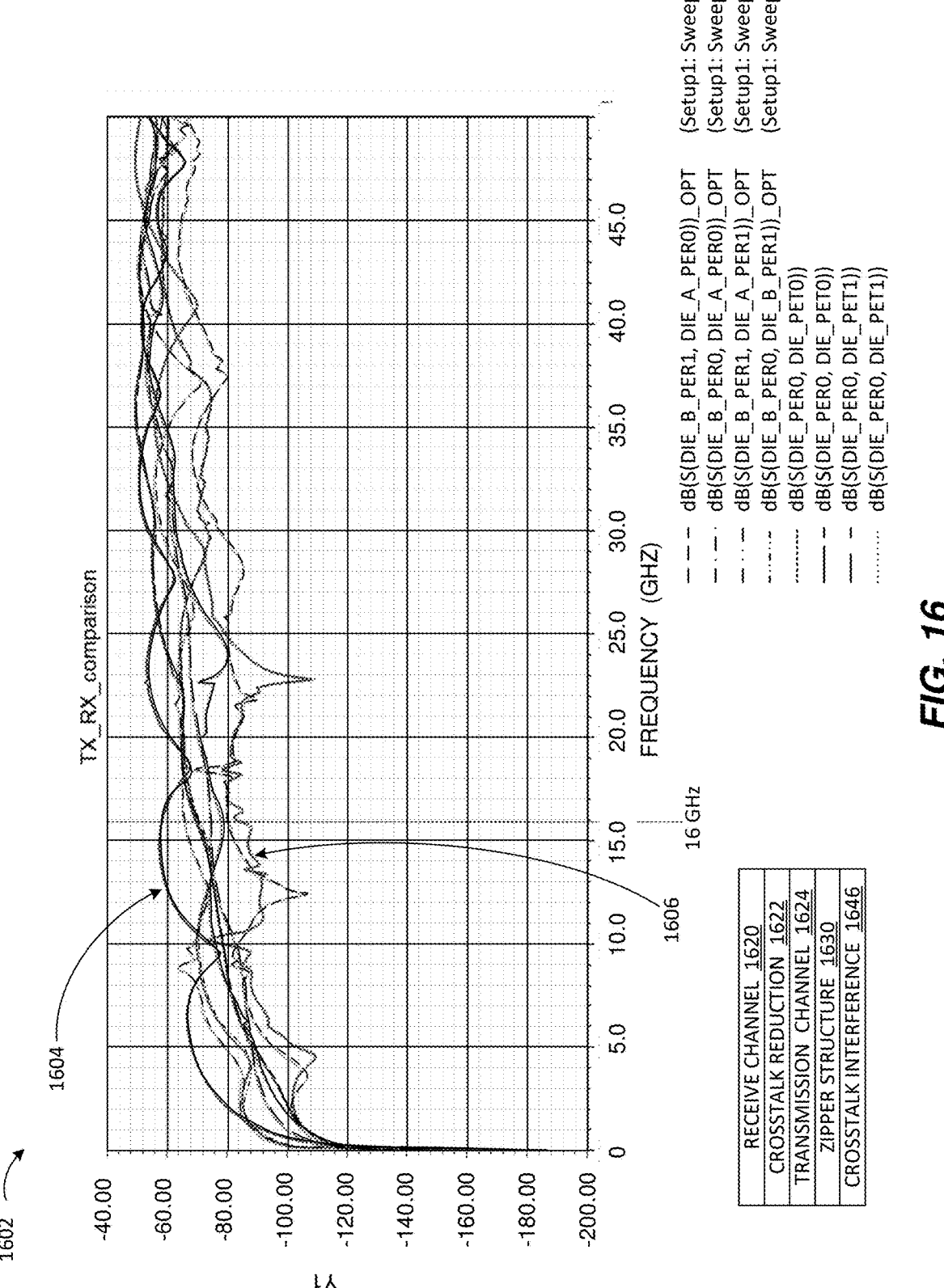
FIG. 16 depicts another example of crosstalk comparison graph for an embodiment of the electronic system.

FIG. 16 illustrates another example of a crosstalk comparison graph 1602 for an embodiment of the electronic system 100. The crosstalk comparison graph 1602 shows a comparison of the crosstalk reduction 1622 between a receive channel 1620 and a transmission channel 1624 over different configurations and over a range of frequencies.

The crosstalk reduction 1622 is the loss of the strength of a crosstalk interference between two points under different configurations. The crosstalk interference 1646 can be between elements such as a pad, solder ball, trace or via. The crosstalk reduction 1622 can represent the difference in power sent and the power received and is expressed in decibels.

The crosstalk comparison graph 1602 shows separate curves for different configurations. For example, a first curve 1604 can represent the signal loss from the die PET0 to a die A PET1. A second curve 1606 can represent the signal loss from the die B PET0 to a die B PET1. The first curve 1604 can indicate a "before" configuration and the second curve 1606 can represent the "after" configuration using the zipper structure 1630.

In one configuration, the first curve 1604 can show a crosstalk reduction 1622 of −66.976 dB and the second curve 1606 can show a crosstalk reduction 1622 of −64.842 dB, both at 16 GHz. Other configurations can show other values.

Figure 17:
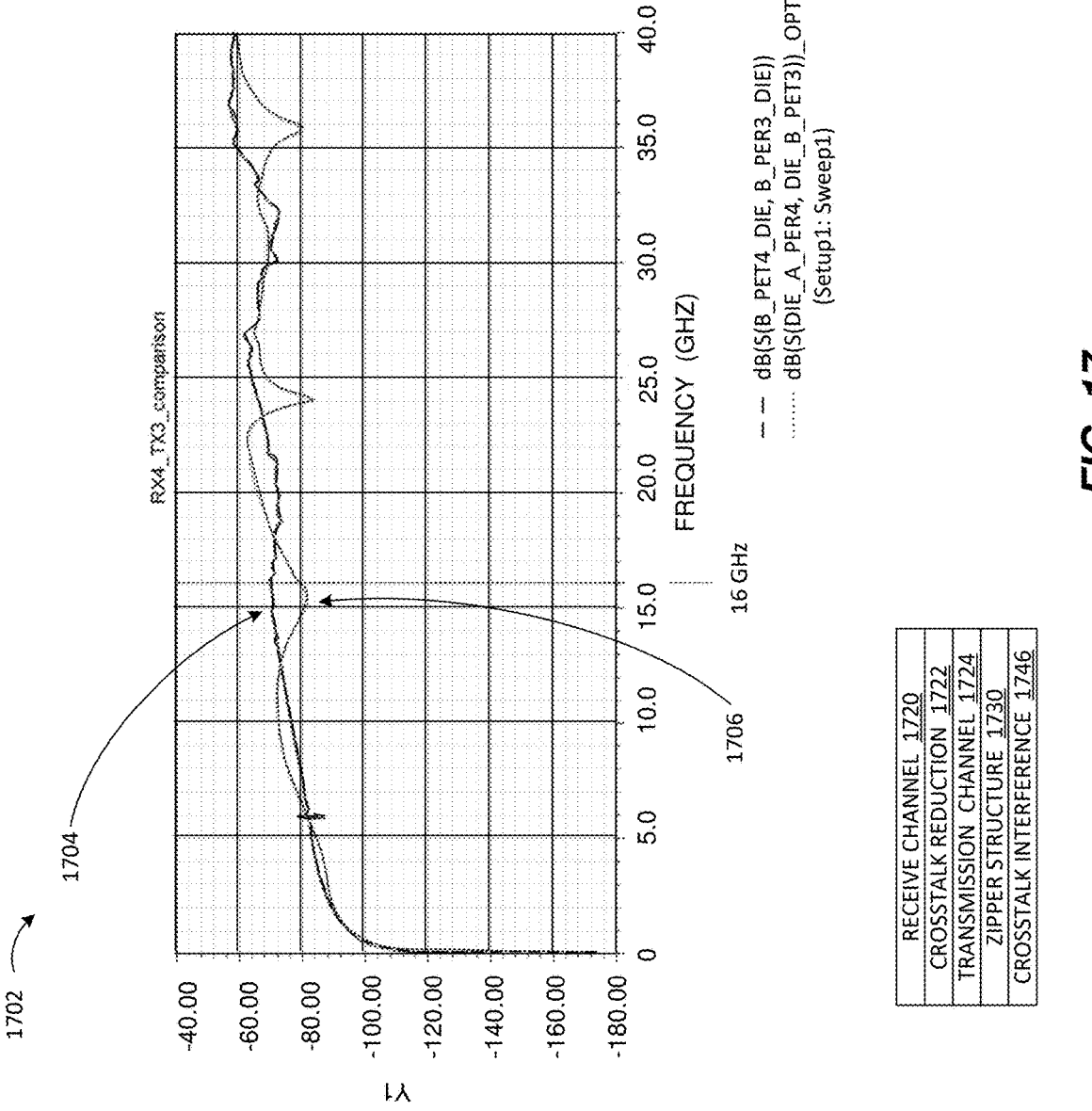
FIG. 17 depicts an example of crosstalk comparison graph for an embodiment of the electronic system.

FIG. 17 illustrates an example of a crosstalk comparison graph 1702 for an embodiment of the electronic system 100. The crosstalk comparison graph 1702 shows a comparison of the crosstalk reduction 1722 between a receive channel 1720 and a transmission channel 1724 over different configurations and over a range of frequencies.

The crosstalk reduction 1722 is the loss of the strength of a crosstalk interference between two points under different configurations. The crosstalk interference 1746 can be between elements such as a pad, solder ball, trace or via. The crosstalk reduction 1722 can represent the difference in power sent and the power received and is expressed in decibels.

The crosstalk comparison graph 1702 shows separate curves for different configurations. For example, a first curve 1704 can represent the signal loss from the die PET0 to a die A PET1. The second curve 1706 can represent the signal loss from the die B PET0 to a die B PET1. The first curve 1704 can indicate a "before" configuration and the second curve 1706 can represent the "after" configuration using a zipper structure 1730.

In one configuration, the first curve 1704 can show a crosstalk reduction 1722 of −69.99 dB and the second curve 1706 can show a crosstalk reduction 1722 of −79.41 dB, both at 16 GHz. Other configurations can show other values.

Figure 18:
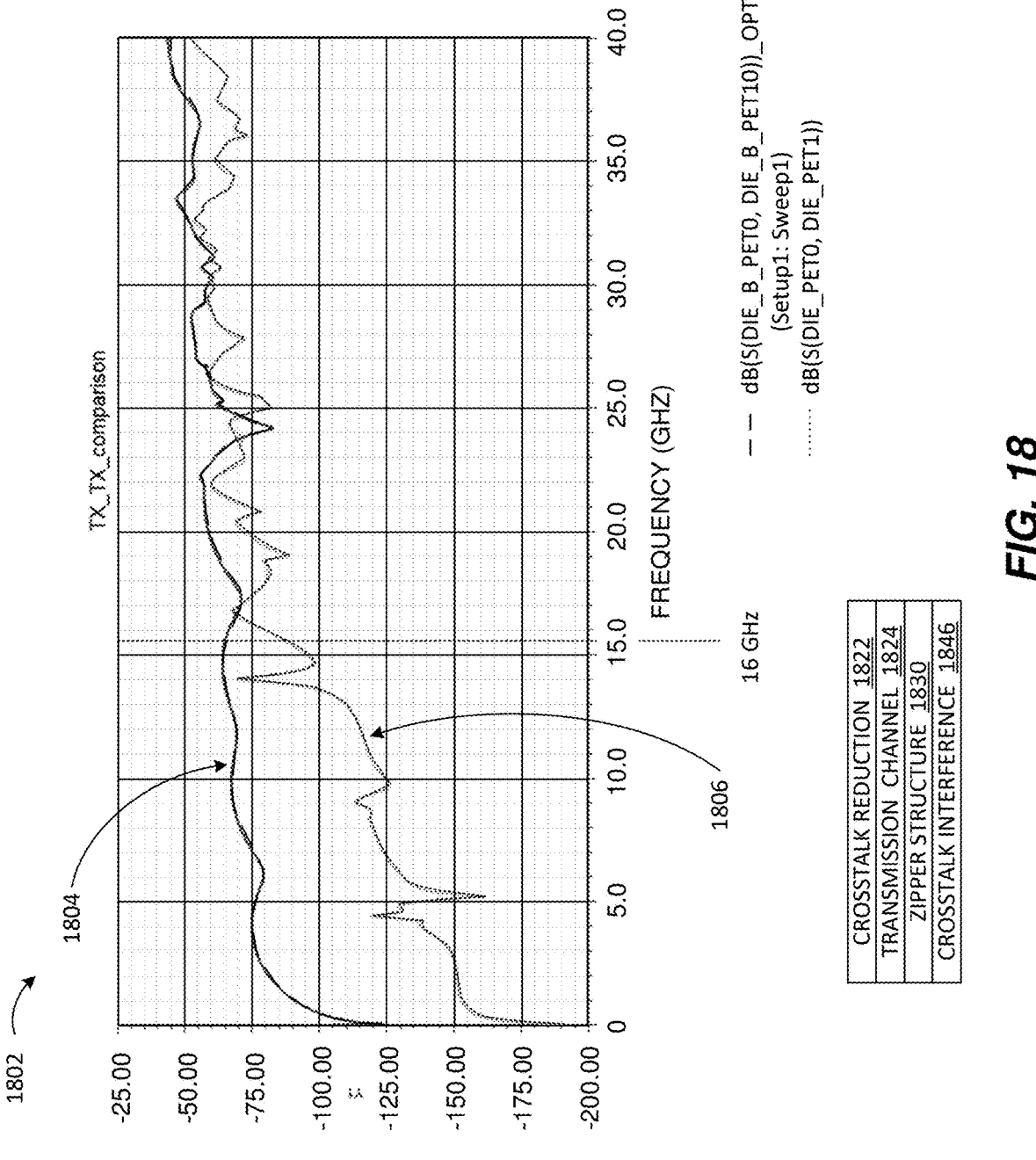
FIG. 18 depicts another example of crosstalk comparison graph for an embodiment of the electronic system.

FIG. 18 illustrates another example of a crosstalk comparison graph 1802 for an embodiment of the electronic system 100. The crosstalk comparison graph 1802 shows a comparison of the crosstalk reduction 1822 between two transmission channels 1824 over different configurations and over a range of frequencies.

The crosstalk reduction 1822 is the loss of the strength of a crosstalk interference between two points under different configurations. The crosstalk interference 1846 can be between elements such as a pad, solder ball, trace or via. The crosstalk reduction 1822 can represent the difference in power sent and the power received and is expressed in decibels.

The crosstalk comparison graph 1802 shows separate curves for different configurations. For example, a first curve 1804 can represent the signal loss from the die PET0 to a die A PET1. A second curve 1806 can represent the signal loss from the die B PET0 to a die B PET1. The first curve 1804 can indicate a "before" configuration and the second curve 1806 can represent the "after" configuration using the zipper structure 1830.

In one embodiment, the first curve 1804 can have a Y1 value of −66.35 at 16 GHz. The second curve 1806 can have a Y1 value of −79.76 at 16 GHZ.

In one configuration, the first curve 1804 can show a crosstalk reduction 1822 of −69.99 dB and the second curve 1806 can show a crosstalk reduction 1822 of −79.41 dB, both at 16 GHz. Other configurations can show other values.

4.0. Functional Overview

FIG. 19 illustrates an example of a manufacturing process flow 1902 for the electronic system 100 in an embodiment. The manufacturing process flow 1902 can describe the steps and process for manufacturing the mounting substrate 1920.

The manufacturing process flow 1902 can include a variety of operations. In an illustrative embodiment, the manufacturing process flow 1902 can include a receiving mounting substrate step 1904, forming lower shield structure step 1906, forming upper shield structure 1908, forming conductor structures step 1910, and an attach components step 1912.

In the receiving mounting substrate step 1904, the initial portion of the mounting substrate can be received by forming a base layer 1994, such as a core layer 1996 of a mounting substrate 1920. The layers have at least two portions, a dielectric layer providing mechanical structural stability and a conductive layer in direct contact over the dielectric layer. The conductive layer can be formed from metal or metal alloys including copper, silver, gold, or other similar conductive materials. The dielectric layer can be formed from a variety of materials, such as fiberglass, resin, or other similar materials. The layers of the mounting substrate provide the basis for forming the traces that support the functionality of the electronic system 100.

In the forming lower shield structure step 1906, a lower shield structure 1980 can be formed on a lower layer 1944 that is formed on the mounting substrate 1920. The lower layer 1944 can have a dielectric portion and a conductive portion. The lower shield structure 1980 can include a lower reference shield 1972 formed over a lower void volume 1958. In one embodiment, the lower void volume 1958 can be formed by removing the conductive material in the area where the lower void volume 1958 is located. In other embodiments, the lower void volume 1958 is the result of not introducing conductive materials in the dielectric material. The lower reference shield 1972 is positioned over the lower void volume 1958. In some embodiments, the lower reference shield 1972 can be formed from two or more elements on the same or different layers.

In the forming upper shield structure step 1908, an upper shield structure 1978 can be formed on an upper layer 1942 that is formed over the lower layer 1944. The upper layer 1942 can have a dielectric portion and a conductive portion. The upper shield structure 1978 can include an upper reference shield 1970 formed over an upper void volume 1956. In one embodiment, the upper void volume 1956 can be formed by removing the conductive material in the area where the upper void volume 1956 is located. The upper reference shield 1970 is positioned over the upper void volume 1956. In some embodiments, the upper reference shield 1970 can be formed from two or more elements on the same or different layers above the void.

In the forming conductor structures step 1910, a top conductor structure 1982 and a bottom conductor structure 1984 can be formed on the mounting substrate 1920. The top conductor structure 1982 can be formed on a top layer 1990 of the mounting substrate 1920 and can include a surface pad 1986 electrically coupled to a via 1908. In some embodiments, the surface pad 1986 can be a capacitor pad 1960 for attaching capacitors or other external components.

The bottom conductor structure 1984 can be formed on a bottom layer 1992 of the mounting substrate 1920. The bottom conductor structure 1984 can include a mounting pad 1988 electrically coupled to a solder ball 1962. The solder balls 1962 can be used to attach other external components to the mounting substrate 1920.

In the attaching components step 1912, external components can be attached to the mounting substrate 1920 using surface pads 1986 and the solder balls 1962. be formed on one of the layers. In some embodiments, the electronic components can be attached to both the top layer 1990 and the bottom layer 1992 of the mounting substrate 1920.

Other examples of these and other embodiments are found throughout this disclosure.

5.0. Example Embodiments

Examples of some embodiments are represented, without limitation, in the following clauses and use cases:

According to an embodiment, a method of manufacture of an electronic system comprises receiving a mounting substrate having at least a base layer, forming a lower shield structure over the base layer, the lower shield structure having a lower reference shield over a lower void volume, forming an upper shield structure over the lower shield structure, the upper shield structure having an upper reference shield over an upper void volume, the upper reference shield and the lower reference shield interlocking to form an interlocking shielding structure horizontally covering the upper void volume and the lower void volume, forming a top conductor structure on a top layer of the mounting substrate, the top conductor structure having a surface pad electrically coupled to a via, and forming a bottom conductor structure having a solder ball on a bottom layer, the interlocking shielding structure positioned directly between the top conductor structure and the bottom conductor structure.

In an embodiment, the method wherein forming the lower shield structure includes configuring the lower void volume and the upper void volume to form a ground reference in an overlap region.

In an embodiment, the method wherein forming the upper shield structure includes forming the upper reference shield overlapping the lower reference shield by an overlap surface area value.

In an embodiment, the method wherein forming the top conductor structure includes coupling the surface pad to a receive channel and attaching an external component to the solder ball.

In an embodiment, the method wherein forming the bottom conductor structure upper shield structure includes coupling the solder ball to a transmission channel.

According to an embodiment, a method of manufacture of an electronic system comprises receiving a mounting substrate having at least a base layer, forming a lower layer on the base layer, the lower layer having a dielectric portion and a conductive portion, the lower layer includes a lower shield structure having a lower reference shield over a lower void volume, the lower reference shield electrically coupled to a ground line, forming an upper layer over the lower layer, the upper layer having a dielectric portion and a conductive portion, the upper layer includes an upper shield structure having an upper reference shield over an upper void volume, the upper reference shield and the lower reference shield interlocking to form an interlocking shielding structure horizontally covering the upper void volume and the lower void volume, and the upper shield structure electrically coupled to a ground line, forming a top conductor structure on a top layer of the mounting substrate, the top conductor structure having a surface pad electrically coupled to a via, forming a bottom conductor structure having a solder ball on a bottom layer, the interlocking shielding structure positioned directly between the top conductor structure and the bottom conductor structure and attaching a ball grid array component to the solder ball.

In an embodiment, the method wherein forming the lower layer includes forming the lower void volume within the dielectric portion of the lower layer.

In an embodiment, the method wherein forming the upper layer includes forming the upper layer having two or more layers between the upper layer and the lower layer.

In an embodiment, the method wherein forming the upper shield structure includes forming the lower shield structure on an adjacent layer to the upper layer.

In an embodiment, the method wherein forming the upper layer includes forming the upper layer adjacent to the lower layer.

According to an embodiment, an electronic system comprises a mounting substrate further comprises a base layer, a lower shield structure over the base layer, the lower shield structure having a lower reference shield over a lower void volume, an upper shield structure over the lower shield structure, the upper shield structure having an upper reference shield over an upper void volume, and the upper reference shield and the lower reference shield interlocking to form an interlocking shielding structure horizontally covering the upper void volume and the lower void volume, a top conductor structure on a top layer of the mounting substrate, the top conductor structure having a surface pad electrically coupled to a via, and a bottom conductor structure having a solder ball on a bottom layer of the mounting substrate, the interlocking shielding structure positioned directly between the top conductor structure and the bottom conductor structure.

In an embodiment, the system wherein the lower void volume and the upper void volume form a ground reference in an overlap region.

In an embodiment, the system wherein the upper reference shield overlaps the lower reference shield by an overlap surface area value.

In an embodiment, the system wherein the surface pad is coupled to a receive channel.

In an embodiment, the system wherein the solder ball is coupled to a transmission channel.

In an embodiment, the system further comprises the lower layer having a dielectric portion and a conductive portion, the lower layer includes the lower reference shield electrically coupled to a ground line, the upper layer having a dielectric portion and a conductive portion with the upper shield structure electrically coupled to a ground line, and an external component attached to the solder ball.

In an embodiment, the system wherein the lower void volume is formed within the dielectric portion of the lower layer.

In an embodiment, the system wherein the upper layer and the lower layer are separated by two or more layers.

In an embodiment, the system wherein the lower shield structure is on an adjacent layer to the upper layer.

In an embodiment, the system wherein the upper layer is adjacent to the lower layer.

6.0. Extensions and Alternatives

As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being coupled to various other components by arrows. These arrows illustrate only certain examples of current flows between or through the components. Neither the direction of the arrows nor the lack of arrow lines between certain components should be interpreted as indicating the existence or absence of a flow between the certain components themselves.

In the specification, embodiments of the invention have been described with reference to numerous specific details that may vary from implementation to implementation. Thus, the sole and exclusive indicator of what is the invention and is intended by the applicants to be the invention, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this system, and not merely according to the specific dependencies recited in the set of claims.

Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

It is understood that the system functionality can be described using terms like module, unit, system, subsystem, pod, and component that represent devices that can be implemented using different combinations of mechanical and electronic elements. The systems and devices can include electric subsystems, mechanical subsystems, and other physical elements to operate and control the system. These elements can include computing elements that can execute the firmware and software of the system to control mechanical features of the system. In addition, the mechanical elements of the system can operate with or without control mechanisms in regular operation.

The invention claimed is:

1. A method of manufacture of an electronic system comprising:

forming a lower shield structure over a base layer in a mounting substrate, the lower shield structure having a lower reference shield over a lower void volume;

forming an upper shield structure over the lower shield structure, the upper shield structure having an upper reference shield over an upper void volume, the upper reference shield and the lower reference shield interlocking to form an interlocking shielding structure horizontally covering the upper void volume and the lower void volume;

forming a top conductor structure on a top layer of the mounting substrate, the top conductor structure having a surface pad electrically coupled to a via; and forming a bottom conductor structure having a solder ball on a bottom layer, the interlocking shielding structure positioned directly between the top conductor structure and the bottom conductor structure.

2. The method of claim 1, wherein forming the lower shield structure includes configuring the lower void volume and the upper void volume to form a ground reference in an overlap region.

3. The method of claim 1, wherein forming the upper shield structure includes forming the upper reference shield overlapping the lower reference shield by an overlap surface area value.

4. The method of claim 1, wherein forming the top conductor structure includes coupling the pad to a receive channel and attaching an external component to the solder ball.

5. The method of claim 1, wherein forming the bottom conductor structure structure includes coupling the solder ball to a transmission channel.

6. A method of manufacture of an electronic system comprising:

forming a lower layer on a base layer in a mounting substrate, the lower layer having a dielectric portion and a conductive portion, the lower layer includes a lower shield structure having a lower reference shield over a lower void volume, the lower reference shield electrically coupled to a ground line;

forming an upper layer over the lower layer, the upper layer having a dielectric portion and a conductive portion, the upper layer includes an upper shield structure having an upper reference shield over an upper void volume, the upper reference shield and the lower reference shield interlocking to form an interlocking shielding structure horizontally covering the upper void volume and the lower void volume, and the upper shield structure electrically coupled to a ground line;

forming a top conductor structure on a top layer of the mounting substrate, the top conductor structure having a surface pad electrically coupled to a via;

forming a bottom conductor structure having a solder ball on a bottom layer, the interlocking shielding structure positioned directly between the top conductor structure and the bottom conductor structure; and attaching a ball grid array component to the solder ball.

7. The method of claim 6, wherein forming the lower layer includes forming the lower void volume within the dielectric portion of the lower layer.

8. The method of claim 6, wherein forming the upper layer includes forming the upper layer having two or more layers between the upper layer and the lower layer.

9. The method of claim 6, wherein forming the upper shield structure includes forming the lower shield structure on an adjacent layer to the upper layer.

10. The method of claim 6, wherein forming the upper layer includes forming the upper layer adjacent to the lower layer.

11. An electronic system comprising:

a mounting substrate further comprising:

a base layer;

a lower shield structure over the base layer, the lower shield structure having a lower reference shield over a lower void volume;

an upper shield structure over the lower shield structure, the upper shield structure having an upper reference shield over an upper void volume, and the upper reference shield and the lower reference shield interlocking to form an interlocking shielding structure horizontally covering the upper void volume and the lower void volume;

a top conductor structure on a top layer of the mounting substrate, the top conductor structure having a surface pad electrically coupled to a via; and a bottom conductor structure having a solder ball on a bottom layer of the mounting substrate, the interlocking shielding structure positioned directly between the top conductor structure and the bottom conductor structure.

12. The system of claim 11, wherein the lower void volume and the upper void volume form a ground reference in an overlap region.

13. The system of claim 11, wherein the upper reference shield overlaps the lower reference shield by an overlap surface area value.

14. The system of claim 11, wherein the surface pad is coupled to a receive channel and an external component is attached to the solder ball.

15. The system of claim 11, wherein the solder ball is coupled to a transmission channel.

16. The system of claim 11, further comprising:

the lower layer having a dielectric portion and a conductive portion, the lower layer including the lower reference shield electrically coupled to a ground line;

the upper layer having a dielectric portion and a conductive portion, the upper layer including the upper shield structure electrically coupled to a ground line; and an external component attached to the solder ball.

17. The system of claim 16, wherein the lower void volume is formed within the dielectric portion of the lower layer.

18. The system of claim 16, wherein the upper layer and the lower layer are separated by two or more layers.

19. The system of claim 16, wherein the lower shield structure is on an adjacent layer to the upper layer.

20. The system of claim 16, wherein the upper layer is adjacent to the lower layer.

* * * * *